(12) United States Patent
Facchetti et al.

(10) Patent No.: US 8,796,672 B2
(45) Date of Patent: Aug. 5, 2014

(54) PERYLENE-IMIDE SEMICONDUCTOR POLYMERS

(75) Inventors: Antonio Facchetti, Chicago, IL (US); He Yan, Skokie, IL (US); Zhihua Chen, Skokie, IL (US); Marcel Kastler, Basel (CH); Florian Doetz, Singapore (SG)

(73) Assignees: Polyera Corporation, Skokie, IL (US); BASF SE, Ludwigshafen (DE)

( * ) Notice: Subject to any disclaimer, the term of this patent is extended or adjusted under 35 U.S.C. 154(b) by 713 days.

(21) Appl. No.: 12/812,531

(22) PCT Filed: Feb. 5, 2009

(86) PCT No.: PCT/EP2009/051311
§ 371 (c)(1),
(2), (4) Date: Jul. 12, 2010

(87) PCT Pub. No.: WO2009/098250
PCT Pub. Date: Aug. 13, 2009

(65) Prior Publication Data
US 2010/0283047 A1    Nov. 11, 2010

Related U.S. Application Data

(60) Provisional application No. 61/026,322, filed on Feb. 5, 2008, provisional application No. 61/026,311, filed on Feb. 5, 2008, provisional application No. 61/050,010, filed on May 2, 2008, provisional application No. 61/088,246, filed on Aug. 12, 2008, provisional application No. 61/088,236, filed on Aug. 12, 2008, provisional application No. 61/088,215, filed on Aug. 12, 2008, provisional application No. 61/112,478, filed on Nov. 7, 2008.

(51) Int. Cl.
*H01L 51/30* (2006.01)
(52) U.S. Cl.
USPC .......... 257/40; 427/240; 427/358; 427/427.4; 427/430.1; 528/321; 528/322
(58) Field of Classification Search
USPC ............ 427/240, 358, 427.4, 430.1; 528/321, 528/322
See application file for complete search history.

(56) References Cited

U.S. PATENT DOCUMENTS

2008/0177073 A1    7/2008  Facchetti et al.
2008/0185577 A1    8/2008  Facchetti et al.

OTHER PUBLICATIONS

Chen et al Oligothiophene-Functionalized Perylene Bisimide System: Synthesis Characterization, and Electrochemical Polymerization Properties, Chem. Mater, 17, 2208-2215, Nov. 2005.*
Zhan et al A High-Mobility Electron-Transport Polymer with Broad Absorption and Its Use in Field-Effect Transistors and All-Polymer Solar Cells), Journal of American Chemical Society, 129, 7246-7247, Oct. 2007.*
USPTO structure search, Jan. 2013.*
International Search Report issued May 26, 2009 in PCT/EP09/051311 filed Feb. 5, 2009.
Zhan, Xiaowei et al., "A High-Mobility Electron-Transport Polymer with Broad Absorption and Its Use in Field-Effect Transistors and All-Polymer Solar Cells", J. Am. Chem., Soc., vol. 129, pp. 7246-7247 and S1-S11, XP002527202, (May 18, 2007).
He, Xiaorong et al., "Synthesis and Characterization of New Types of Perylene Bisimide-Containing Conjugated Copolymers", Macromolecular Rapid Communications, vol. 26, pp. 721-727, XP002527203, (2005).
He, Xiaorong et al., "A New Copolymer Containing Perylene Bisimide and Porphyrin Moieties: Synthesis and Characterization", Macromolecular Chemistry and Physics, vol. 206, pp. 2199-2205, XP002527204, (2005).
U.S. Appl. No. 61/057,547, filed May 30, 2008, Facchetti, et al.
U.S. Appl. No. 61/026,311, filed Feb. 5, 2008, Kastler, et al.
U.S. Appl. No. 61/026,322, filed Feb. 5, 2008, Facchetti, et al.
U.S. Appl. No. 61/050,010, filed May 2, 2008, Chen, et al.
U.S. Appl. No. 61/088,215, filed Aug. 12, 2008, Facchetti, et al.
U.S. Appl. No. 61/088,236, filed Aug. 12, 2008, Facchetti, et al.
U.S. Appl. No. 61/088,246, filed Aug. 12, 2008, Facchetti, et al.
U.S. Appl. No. 60/859,761, filed Nov. 17, 2006, Facchetti, et al.
U.S. Appl. No. 60/879,145, filed Jan. 8, 2007, Facchetti, et al.
U.S. Appl. No. 13/128,961, filed May 12, 2011, Quinn, et al.

* cited by examiner

*Primary Examiner* — Gregory Listvoyb
(74) *Attorney, Agent, or Firm* — Karen K. Chan

(57) ABSTRACT

Disclosed are new semiconductor materials prepared from perylene-imide copolymers. Such polymers can exhibit high n-type carrier mobility and/or good current modulation characteristics. In addition, the compounds of the present teachings can possess certain processing advantages such as solution-processability and/or good stability at ambient conditions.

5 Claims, 7 Drawing Sheets

PERYLENE-IMIDE SEMICONDUCTOR POLYMERS

CROSS REFERENCE TO RELATED APPLICATION

This application claims priority to and the benefit of U.S. Provisional Patent Application Ser. Nos. 61/026,322, filed on Feb. 5, 2008; 61/026,311, filed on Feb. 5, 2008; 61/050,010, filed on May 2, 2008; 61/088,236, filed on Aug. 12, 2008; 61/088,246, filed on Aug. 12, 2008; 61/088,215, filed on Aug. 12, 2008; and 61/112,478, filed on Nov. 7, 2008, the disclosure of each of which is incorporated by reference herein in its entirety.

BACKGROUND

A new generation of optoelectronic devices such as organic thin film transistors (OTFTs), organic light emitting devices (OLEDs), printable circuits, organic photovoltaic devices, capacitors and sensors are built upon organic semiconductors as their active components. To achieve high speed performance and efficient operation, it is desirable that both the p-type and n-type semiconductor materials in these organic semiconductor-based devices exhibit high charge carrier mobility ($\mu$) and stability under ambient conditions, and can be processed in a cost-effective manner.

Several p- and n-channel molecular semiconductors have achieved acceptable device performance and stability. For example, OTFTs based on certain acenes, oligothiophenes (p-channel) and perylenes (n-channel) can exhibit carrier mobilities ($\mu$'s) greater than about 0.5 $cm^2/Vs$ under ambient conditions. However, molecular semiconductors tend to have less desirable solution film processing properties than polymeric semiconductors. In addition, while high-performance p-channel polymers with $\mu$'s greater than about 0.1 $cm^2/Vs$ have been reported, n-channel polymers for OTFTs to date either suffer from poor processability and/or negligible electron mobilities under ambient conditions.

Accordingly, the art desires new polymeric semiconductors, particularly n-type polymeric semiconductors, that have good stability, processing properties, and/or charge transport characteristics under ambient conditions.

SUMMARY

In light of the foregoing, the present teachings provide perylene-based semiconducting polymers that can address various deficiencies and shortcomings of the prior art, including those outlined above. Also provided are associated devices and related methods for the preparation and use of these polymers. The present polymers can exhibit properties such as excellent charge transport characteristics under ambient conditions, chemical stability, low-temperature processability, large solubility in common solvents, and processing versatility (e.g., printability). As a result, field effect devices such as thin film transistors that incorporate one or more of the present polymers as the semiconductor layer can have high performance under ambient conditions, for example, demonstrating one or more of large electron mobilities, low threshold voltages, and high current on-off ratios. Similarly, other organic semiconductor-based devices such as OPVs, OLETs, and OLEDs can be fabricated efficiently using the polymeric materials described herein.

More specifically, the present polymers can include, but are not limited to, the polymers represented by the following formulae:

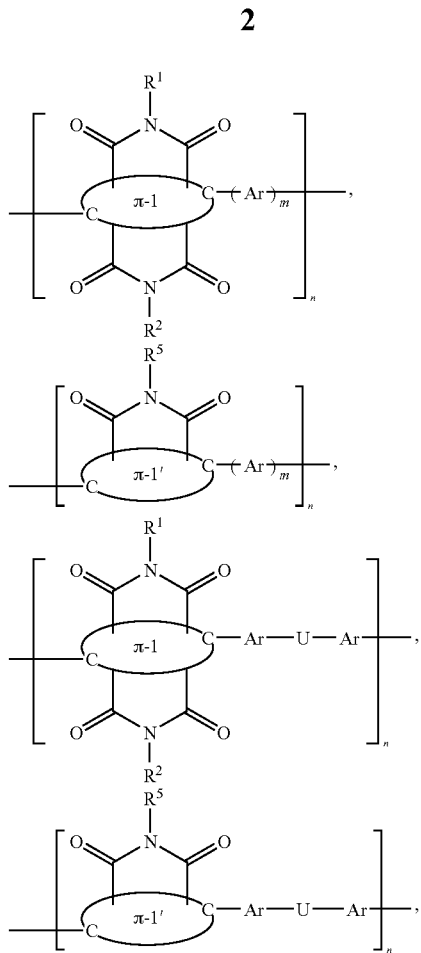

wherein $\pi$-1, $\pi$-1', Ar, $R^1$, $R^2$, $R^5$, U, m, and n are as defined herein.

The present teachings also provide methods of preparing such polymers and semiconductor materials, as well as various compositions, composites, and devices that incorporate the polymers and semiconductor materials disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

DETAILED DESCRIPTION

Figure 1:
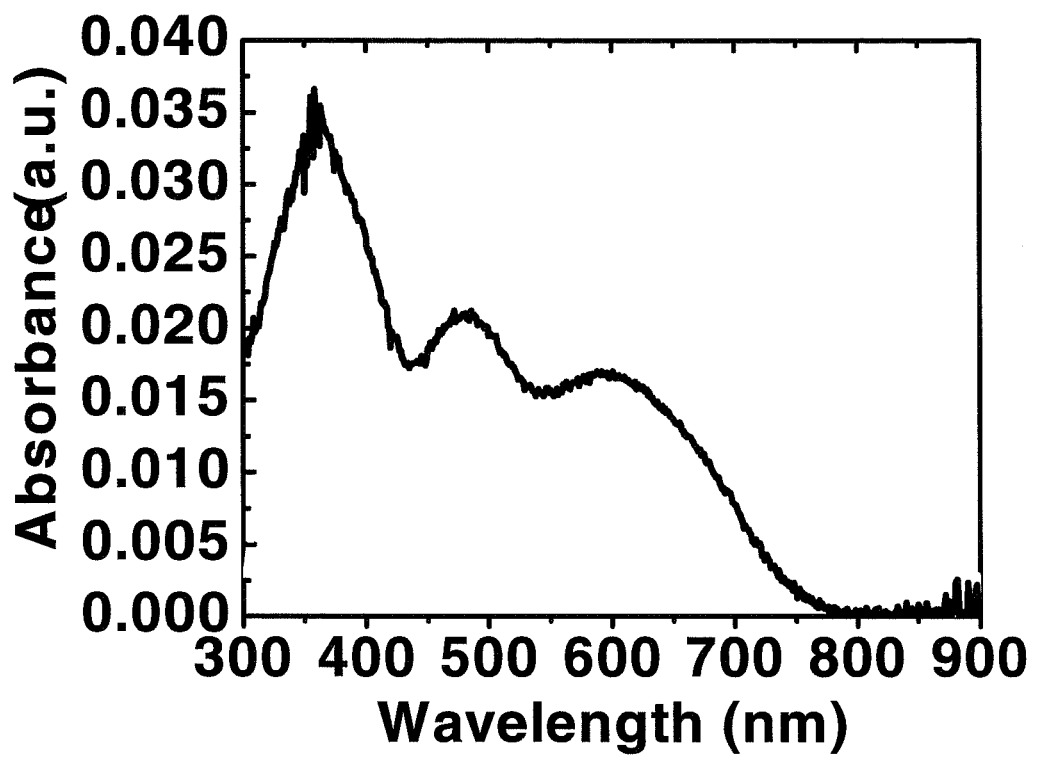
FIG. 1 shows a UV-vis spectrum of a representative polymer of the present teachings (P(PDI2OD-T2)) in the form of a thin film spin-coated on a glass substrate.

The present teachings provide organic semiconductor materials that include one or more perylene-based semiconducting polymers, and associated compositions, composites, and/or devices. Polymers of the present teachings can exhibit semiconductor behavior such as high carrier mobility and/or good current modulation characteristics in a field-effect device, light absorption/charge separation in a photovoltaic device, and/or charge transport/recombination/light emission in a light-emitting device. In addition, the present polymers can possess certain processing advantages such as solution-processability and/or good stability (for example, air stability) in ambient conditions. The polymers of the present teachings can be used to prepare either p-type or n-type semiconductor materials, which in turn can be used to fabricate various organic electronic articles, structures and devices, including field-effect transistors, unipolar circuitries, complementary circuitries, photovoltaic devices, and light emitting devices.

Accordingly, one aspect of the present teachings provides polymers having semiconducting activity and semiconductor materials prepared from these polymers. More specifically, the polymers can be A-B copolymers comprising a first repeating unit (monomer A, $M_1$) that includes an aromatic imide (e.g., perylene imide or its heteroatom analogs), and a second repeating unit (monomer B, $M_2$) that includes one or more cyclic moieties. In various embodiments, both monomer A and monomer B can include an aromatic or otherwise highly conjugated cyclic (carbocyclic or heterocyclic) moieties, where such cyclic moieties can be optionally substituted or functionalized with one or more electron-withdrawing or electron-donating groups. The pairing of monomers A and B, the imide position functionalization of monomer A, and any additional functionalization on either monomer can be affected by one or more of the following considerations: 1) the electron-withdrawing capability for semiconductor processing in air and stable charge transport operation; 2) modulation of the majority carrier type depending on the electronic structure of monomers A and B; 3) regiochemistry of the polymerization possibly affording regioregular polymers; 4) the core planarity and linearity of the polymer chain; 5) the capability of additional functionalization of the π-conjugated core; 6) the potential for increased solubility of the polymer for solution processing; 7) achieving strong π-π interactions/intermolecular electronic coupling; and 8) bandgap modulation via electron donor-acceptor coupling of electron-poor (acceptor) and electron-rich (donor) A-B or B-A repeating units. The resulting polymers and related methods can be employed to enhance the performance of an associated device (e.g., an organic field effect transistor, a light-emitting transistor, a solar cell, or the like).

More specifically, monomer A of the present polymers generally comprises an optionally substituted (core-substituted and/or imide-substituted) perylene diimide or monoimide, while monomer B generally comprises one or more optionally substituted aromatic monocyclic moieties. In certain embodiments, monomer B can include one or more linkers and/or one or more polycyclic moieties in addition to the one or more monocyclic moieties. In various embodiments, monomer B as a whole can comprise a highly conjugated system. The present teachings also relate to homopolymers of monomer A.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components and can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value.

It should be understood that the order of steps or order for performing certain actions is immaterial so long as the present teachings remain operable. Moreover, two or more steps or actions may be conducted simultaneously.

As used herein, a "polymer" or "polymeric compound" refers to a molecule (e.g., a macromolecule) including a plurality of one or more repeating units connected by covalent chemical bonds. A polymer can be represented by the general formula:

wherein M is the repeating unit or monomer, and n is the number of M's in the polymer. For example, if n is 3, the polymer shown above is understood to be:

The polymer or polymeric compound can have only one type of repeating unit as well as two or more types of different repeating units. In the former case, the polymer can be referred to as a homopolymer. In the latter case, the term "copolymer" or "copolymeric compound" can be used instead, especially when the polymer includes chemically significantly different repeating units. The polymer or polymeric compound can be linear or branched. Branched polymers can include dendritic polymers, such as dendronized polymers, hyperbranched polymers, brush polymers (also called bottle-brushes), and the like. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and can be optionally substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which can be optionally substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which can be optionally substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and can include polycyclic aromatic hydrocarbons such as rylenes (or analogs thereof containing one or more heteroatoms) having the formula:

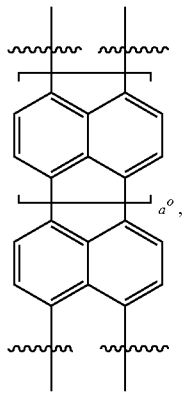

where $a^o$ can be an integer in the range of 0-3; coronenes (or analogs thereof containing one or more heteroatoms) having the formula:

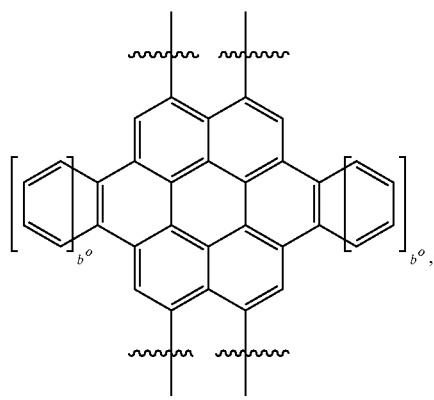

where $b^o$ can be an integer in the range of 0-3; and linear acenes (or analogs thereof containing one or more heteroatoms) having the formula:

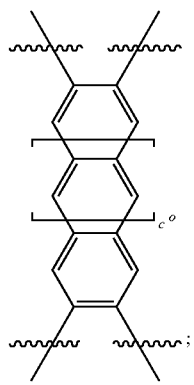

where $c^o$ can be an integer in the range of 0-4. The fused ring moiety can be optionally substituted as described herein.

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, ten-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula —$C_zH_{2z+1-t}X^0{}_t$, where $X^0$, at each occurrence, is F, Cl, Br or I, z is an integer in the range of 1 to 40, and t is an integer in the range of 1 to 81, provided that t is less than or equal to 2z+1. Haloalkyl groups that are not perhaloalkyl groups can be substituted as described herein.

As used herein, "alkoxy" refers to —O-alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O-alkyl group can be substituted as described herein.

As used herein, "alkylthio" refers to an —S-alkyl group (which, in some cases, can be expressed as —S(O)$_w$-alkyl, wherein w is 0). Examples of alkylthio groups include, but are not limited to, methylthio, ethylthio, propylthio (e.g., n-propylthio and isopropylthio), t-butylthio, pentylthio, hexylthio groups, and the like. The alkyl group in the —S-alkyl group can be substituted as described herein.

As used herein, "arylalkyl" refers to an -alkyl-aryl group, where the arylalkyl group is covalently linked to the defined chemical structure via the alkyl group. An arylalkyl group is within the definition of a —Y—$C_{6-14}$ aryl group, where Y is as defined herein. An example of an arylalkyl group is a benzyl group (—$CH_2$—$C_6H_5$). An arylalkyl group can be optionally substituted, i.e., the aryl group and/or the alkyl group, can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or Spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyllaromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

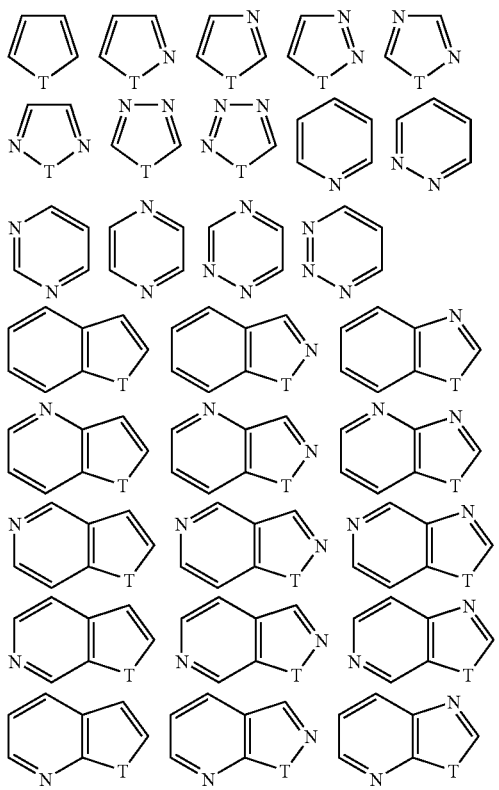

where T is O, S, NH, N-alkyl, N-aryl, N-(arylalkyl) (e.g., N-benzyl), SiH$_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Polymers of the present teachings can include a "divalent group" defined herein as a linking group capable of forming a covalent bond with two other moieties. For example, polymers of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group). a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., —Ar—) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —NO$_2$, —CN, —NC, —S(R$^o$)$_2^+$, —N(R$^o$)$_3^+$, —SO$_3$H, —SO$_2$R$^o$, —SO$_3$R$^o$, —SO$_2$NHR$^o$, —SO$_2$N(R$^o$)$_2$, —COOH, —COR$^o$, —COOR$^o$, —CONHR$^o$, —CON(R$^o$)$_2$, $C_{1-40}$ haloalkyl groups, $C_{6-14}$ aryl groups, and 5-14 membered electron-poor heteroaryl groups; where R$^o$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electron-withdrawing groups such as F, Cl, Br, —NO$_2$, —CN, —NC, —S(R$^o$)$_2^+$, —N(R$^o$)$_3^+$, —SO$_3$H, —SO$_2$R$^o$, —SO$_3$R$^o$, —SO$_2$NHR$^o$, —SO$_2$N(R$^o$)$_2$, —COOH, —COR$^o$, —COOR$^o$, —CONHR$^o$, and —CON(R$^o$)$_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —OR$^0$, —NH$_2$, —NHR$^0$, —N(R$^0$)$_2$, and 5-14 membered electron-rich heteroaryl groups, where R$^0$ is a C$_{1-20}$ alkyl group, a C$_{2-20}$ alkenyl group, a C$_{2-20}$ alkynyl group, a C$_{6-14}$ aryl group, or a C$_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

At various places in the present specification, substituents of monomers A and B are disclosed in groups or in ranges. It is specifically intended that the description include each and every individual subcombination of the members of such groups and ranges. For example, the term "C$_{1-6}$ alkyl" is specifically intended to individually disclose C$_1$, C$_2$, C$_3$, C$_4$, C$_5$, C$_6$, C$_1$-C$_6$, C$_1$-C$_5$, C$_1$-C$_4$, C$_1$-C$_3$, C$_1$-C$_2$, C$_2$-C$_6$, C$_2$-C$_5$, C$_2$-C$_4$, C$_2$-C$_3$, C$_3$-C$_6$, C$_3$-C$_5$, C$_3$-C$_4$, C$_4$-C$_6$, C$_4$-C$_5$, and C$_5$-C$_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Polymers described herein can contain an asymmetric atom (also referred as a chiral center) and some of the compounds can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of polymers containing alkenyl moieties (e.g., alkenes, azo, and imines). It also should be understood that the polymers of the present teachings encompass all possible regioisomers in pure form and mixtures thereof. In some embodiments, the preparation of the present polymers can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide (N$_3$), thiocyanate (SCN), nitro (NO$_2$), cyanate (CN), water (H$_2$O), ammonia (NH$_3$), and sulfonate groups (e.g., OSO$_2$—R, wherein R can be a C$_{1-10}$ alkyl group or a C$_{6-14}$ aryl group each optionally substituted with 1-4 groups independently selected from a C$_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

As used herein, a "p-type semiconductor material" or a "p-type semiconductor" refers to a semiconductor material having holes as the majority current carriers. In some embodiments, when a p-type semiconductor material is deposited on a substrate, it can provide a hole mobility in excess of about $10^{-5}$ cm$^2$/Vs. In the case of field-effect devices, a p-type semiconductor can also exhibit a current on/off ratio of greater than about 10.

As used herein, an "n-type semiconductor material" or an "n-type semiconductor" refers to a semiconductor material having electrons as the majority current carriers. In some embodiments, when an n-type semiconductor material is deposited on a substrate, it can provide an electron mobility in excess of about $10^{-5}$ cm$^2$/Vs. In the case of field-effect devices, an n-type semiconductor can also exhibit a current on/off ratio of greater than about 10.

As used herein, "field effect mobility" refers to a measure of the velocity with which charge carriers, for example, holes (or units of positive charge) in the case of a p-type semiconductor material and electrons in the case of an n-type semiconductor material, move through the material under the influence of an electric field.

As used herein, a compound can be considered "ambient stable" or "stable at ambient conditions" when the carrier mobility or the reduction-potential of the compound is maintained at about its initial measurement when the compound is exposed to ambient conditions, for example, air, ambient temperature, and humidity, over a period of time. For example, a compound can be described as ambient stable if its carrier mobility or reduction potential does not vary more than 20% or more than 10% from its initial value after exposure to ambient conditions, including, air, humidity and temperature, over a 3 day, 5 day, or 10 day period.

As used herein, "solution-processable" refers to compounds (e.g., polymers), materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

Throughout the specification, structures may or may not be presented with chemical names. Where any question arises as to nomenclature, the structure prevails.

In various embodiments, the present polymers can be represented by the formula:

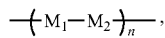

wherein $M_1$ is an optionally substituted perylene imide selected from:

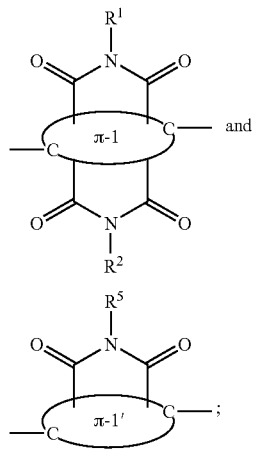

$M_2$ has a formula selected from:

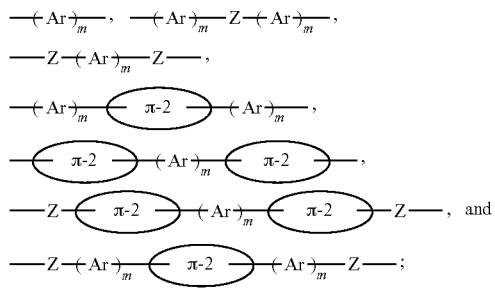

n is an integer greater than or equal to 2; and
$R^1$, $R^2$, $R^5$, π-1, π-1', Ar, Z, and m are as defined herein.

More specifically, in the formula of $M_1$ selected from:

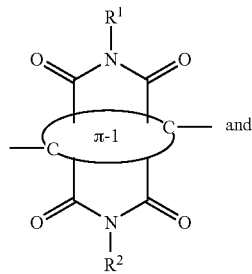

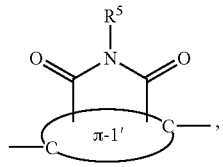

π-1 can be a perylenyl group or a heteroatom analog thereof which can be optionally substituted with 1-6 substituents independently selected from a) an electron-withdrawing group and b) a $C_{1-40}$ alkyl group optionally substituted with 1-5 electron-withdrawing groups;

π-1' can be a perylenyl group or a heteroatom analog thereof optionally substituted with 1-8 substituents independently selected from a) an electron-withdrawing group and b) a $C_{1-40}$ alkyl group optionally substituted with 1-5 electron-withdrawing groups; and $R^1$, $R^2$, and $R^5$, independently can be selected from H, a $C_{1-40}$ alkyl group, a $C_{2-40}$ alkenyl group, a $C_{1-40}$ haloalkyl group, and 1-4 cyclic moieties,
wherein:
each of the $C_{1-40}$ alkyl group, the $C_{2-40}$ alkenyl group, and the $C_{1-40}$ haloalkyl group can be optionally substituted with 1-10 substituents independently selected from a halogen, —CN, $NO_2$, OH, —$NH_2$, —NH($C_{1-20}$ alkyl), —N($C_{1-20}$alkyl)$_2$, —S(O)$_2$OH, —CHO, —C(O)—$C_{1-20}$ alkyl, —C(O)OH, —C(O)—O$C_{1-20}$ alkyl, —C(O)$NH_2$, —C(O)NH—$C_{1-20}$ alkyl, —C(O)N($C_{1-20}$ alkyl)$_2$, —O$C_{1-20}$ alkyl, —$SiH_3$, —SiH($C_{1-20}$ alkyl)$_2$, —$SiH_2$($C_{1-20}$ alkyl), and —Si($C_{1-20}$ alkyl)$_3$;
each of the $C_{1-40}$ alkyl group, the $C_{2-40}$ alkenyl group, and the $C_{1-40}$ haloalkyl group can be covalently bonded to the imide nitrogen atom via an optional linker; and
each of the 1-4 cyclic moieties can be the same or different, can be covalently bonded to each other or the imide nitrogen via an optional linker, and can be optionally substituted with 1-5 substituents independently selected from a halogen, oxo, —CN, $NO_2$, OH, =C(CN)$_2$, —$NH_2$, —NH($C_{1-20}$ alkyl), —N($C_{1-20}$alkyl)$_2$, —S(O)$_2$OH, —CHO, —C(O)OH, —C(O)—$C_{1-20}$ alkyl, —C(O)—O$C_{1-20}$ alkyl, —C(O)$NH_2$, —C(O)NH—$C_{1-20}$ alkyl, —C(O)N($C_{1-20}$ alkyl)$_2$, —$SiH_3$, —SiH($C_{1-20}$alkyl)$_2$, —$SiH_2$($C_{1-20}$ alkyl), —Si($C_{1-20}$alkyl)$_3$, —O—$C_{1-20}$alkyl, —O—$C_{1-20}$alkenyl, —O—$C_{1-20}$haloalkyl, a $C_{1-20}$ alkyl group, a $C_{1-20}$ alkenyl group, and a $C_{1-20}$haloalkyl group.

In various embodiments, π-1, at each occurrence, independently can be selected from:

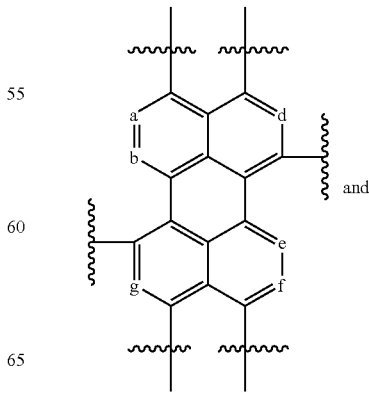

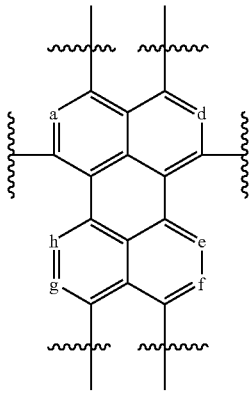

wherein a, b, d, e, f, g, and h independently are $CR^d$, $SiR^d$, N, or P; and $R^d$, at each occurrence, independently is selected from a) H, b) an electron-withdrawing group, and c) a $C_{1-40}$ alkyl group optionally substituted with 1-5 electron-withdrawing groups. In some embodiments, each of a, b, d, e, f, g, and h can be $CR^d$. Accordingly, for example, π-1, at each occurrence, independently can be selected from:

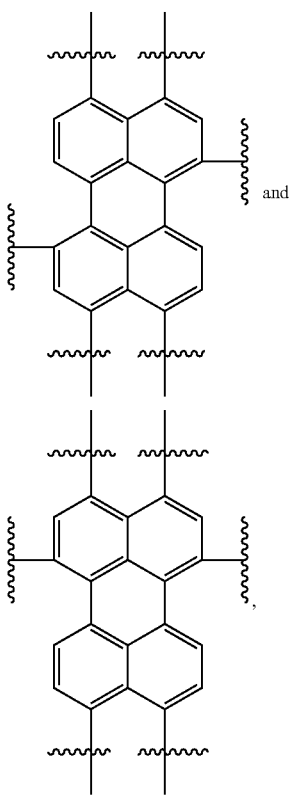

which optionally can be substituted with 1-4 $R^d$ groups, where $R^d$ is as defined herein.

In various embodiment, π-1', at each occurrence, independently can be selected from:

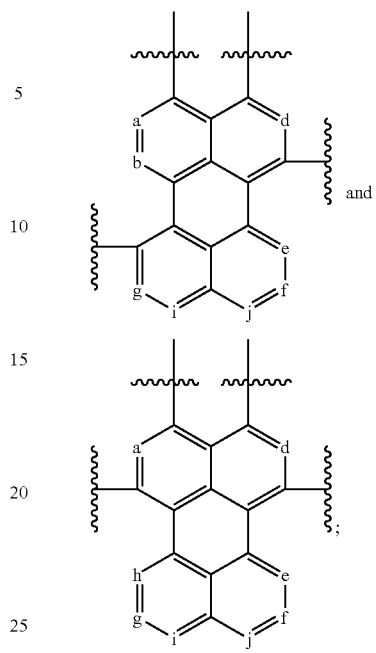

wherein a, b, d, e, f, g, h, i, and j independently are $CR^d$, $SiR^d$, N, or P; and $R^d$, at each occurrence, independently is selected from a) H, b) an electron-withdrawing group, and c) a $C_{1-40}$ alkyl group optionally substituted with 1-5 electron-withdrawing groups. In some embodiments, each of a, b, d, e, f, g, h, i, and j independently can be $CR^d$. Accordingly, for example, π-1', at each occurrence, independently can be selected from:

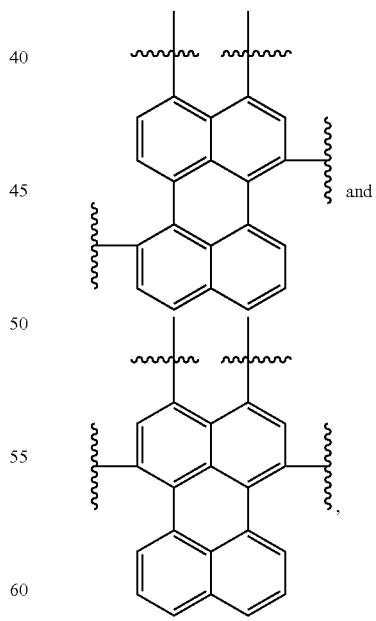

which optionally can be substituted with 1-6 $R^d$ groups, where $R^d$ is as defined herein.

In various embodiments, Ar, at each occurrence, independently can be selected from:

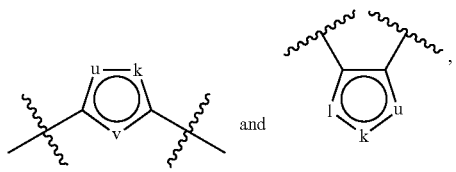
and wherein:
k, l, u, and v independently are selected from —O—, —S—, —CR³=CR⁴—, —CR³=, =CR³—, —C(O)—, —C(C(CN)₂)—, —N=, =N—, —NR³—, and —CR³=N—;

R³ and R⁴, at each occurrence, are independently selected from a) H, b) halogen, c) —CN, d) —NO₂, e) —OH, f) —CHO, g) —C(O)—C$_{1-10}$ alkyl, h) —C(O)—C$_{6-14}$aryl, i) —C(O)OH, j) —C(O)—OC$_{1-10}$ alkyl, k) —C(O)—OC$_{6-14}$aryl, l) —C(O)NH₂, m) —C(O)NH—C$_{1-10}$alkyl, n) —C(O)N(C$_{1-10}$ alkyl)₂, o) —C(O)NH—C$_{6-14}$aryl, p) —C(O)N(C$_{1-10}$ alkyl)—C$_{6-14}$aryl, q) —C(O)N(C$_{6-14}$ aryl)₂, r) a C$_{1-40}$ alkyl group, s) a C$_{2-40}$ alkenyl group, t) a C$_{2-40}$ alkynyl group, u) a C$_{1-40}$ alkoxy group, v) a C$_{1-40}$ alkylthio group, w) a C$_{1-40}$haloalkyl group, x) a —Y—C$_{3-14}$cycloalkyl group, y) a —Y—C$_{6-14}$ aryl group, z) a —Y-3-14 membered cycloheteroalkyl group, and aa) a —Y-5-14 membered heteroaryl group, wherein each of the C$_{1-40}$ alkyl group, the C$_{2-40}$ alkenyl group, the C$_{2-40}$ alkynyl group, the C$_{3-14}$ cycloalkyl group, the C$_{6-14}$ aryl group, the 3-14 membered cycloheteroalkyl group, and the 5-14 membered heteroaryl group optionally is substituted with 1-5 substituents independently selected from halogen, —CN, a C$_{1-6}$ alkyl group, a C$_{1-6}$ alkoxy group, and a C$_{1-6}$ haloalkyl group; and Y, at each occurrence, is independently selected from a divalent C$_{1-6}$ alkyl group, a divalent C$_{1-6}$ haloalkyl group, and a covalent bond.

Depending on whether it is located within the polymeric backbone or it constitutes one of the end groups of the polymer, Ar can be divalent or monovalent. In certain embodiments, each Ar can be independently a 5- or 6-membered aryl or heteroaryl group. For example, each Ar can be selected from a phenyl group, a thienyl group, a furyl group, a pyrrolyl group, an isothiazolyl group, a thiazolyl group, a 1,2,4-thiadiazolyl group, a 1,3,4-thiadiazolyl group, and a 1,2,5-thiadiazolyl group, wherein each group can be divalent or monovalent, and optionally can be substituted with 1-4 substituents independently selected from a halogen, —CN, a C$_{1-6}$ alkyl group, a C$_{1-6}$ alkoxy group, and a C$_{1-6}$ haloalkyl group. In particular embodiments, each Ar can be selected from a thienyl group, an isothiazolyl group, a thiazolyl group, a 1,2,4-thiadiazolyl group, a 1,3,4-thiadiazolyl group, and a 1,2,5-thiadiazolyl group, wherein each group optionally can be substituted with 1-2 substituents independently selected from a halogen, —CN, a C$_{1-6}$ alkyl group, a C$_{1-6}$ alkoxy group, and a C$_{1-6}$ haloalkyl group. In various embodiments, Ar is unsubstituted. In some embodiments, Ar can be substituted with 1-2 C$_{1-6}$ alkyl groups.

By way of example, (Ar)$_m$ can be selected from:

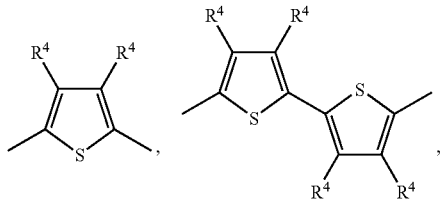

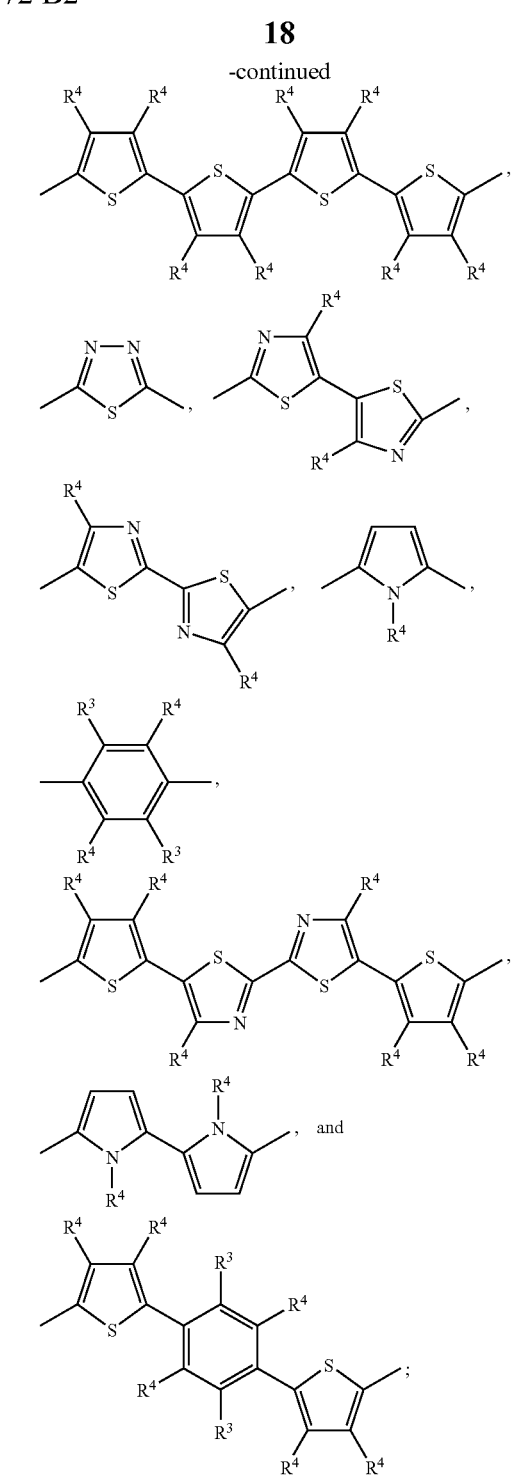

wherein R³ and R⁴ are as defined herein. In particular embodiments,

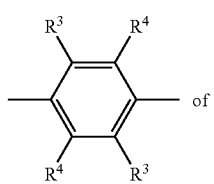 of

-continued

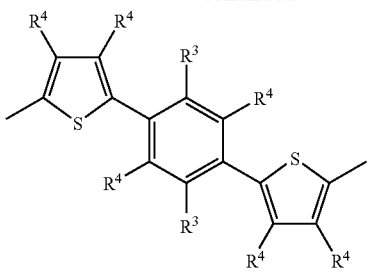

can be selected from:

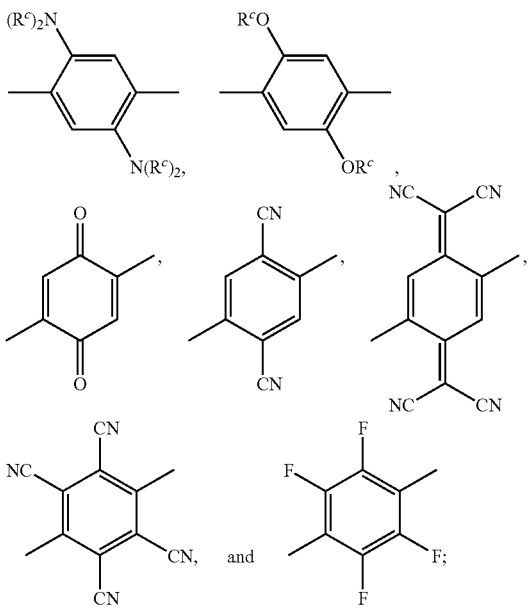

wherein $R^c$, at each occurrence, is independently selected from H, a $C_{1-6}$ alkyl group, and a —Y—$C_{6-14}$ aryl group.

In various embodiments, the linker Z can be a conjugated system by itself (e.g., including two or more double or triple bonds) or can form a conjugated system with its neighboring components. For example, in embodiments where Z is a linear linker, Z can be a divalent ethenyl group (i.e., having one double bond), a divalent ethynyl group (i.e., having one triple bond), a $C_{4-40}$ alkenyl or alkynyl group that includes two or more conjugated double or triple bonds, or some other non-cyclic conjugated systems that can include heteroatoms such as Si, N, P, and the like. For example, Z can be selected from:

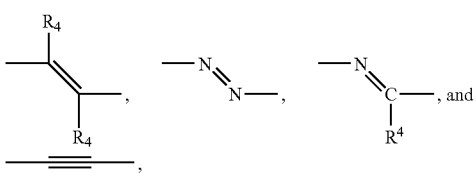

wherein $R^4$ is as defined herein. In certain embodiments, Z can be selected from:

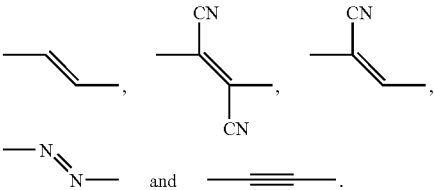

In various embodiments, π-2 can be an optionally substituted polycyclic moiety. In some embodiments, π-2 can have a planar and highly conjugated cyclic core. Examples of suitable cyclic cores include benzene, naphthalene, anthracene, tetracene, pentacene, perylene, pyrene, coronene, fluorene, indacene, indenofluorene, and tetraphenylene, as well as their analogs in which one or more carbon atoms can be replaced with a heteroatom such as O, S, Si, Se, N, or P. In addition, each of the planar and highly conjugated cyclic core optionally can be substituted as described herein.

In certain embodiments, π-2 can be an optionally substituted polycyclic moiety (e.g., a fused-ring moiety) having two or more (e.g., 2-5) five-, six-, and/or seven-membered rings. For example, π-2 can be an optionally substituted $C_{6-24}$ aryl group or an optionally substituted 6-24 membered heteroaryl group.

In some embodiments, π-2 can be optionally substituted with 1-6 $R^f$ groups, wherein:

$R^f$, at each occurrence, is independently selected from a) halogen, b) —CN, c) —NO$_2$, d) oxo, e) —OH, f) =C(R$^g$)$_2$, g) a $C_{1-40}$ alkyl group, h) a $C_{2-40}$ alkenyl group, i) a $C_{2-40}$ alkynyl group, j) a $C_{1-40}$ alkoxy group, k) a $C_{1-40}$ alkylthio group, l) a $C_{1-40}$ haloalkyl group, m) a —Y—$C_{3-10}$ cycloalkyl group, n) a —Y—$C_{6-14}$ aryl group, o) a —Y—$C_{6-14}$ haloaryl group, p) a —Y-3-12 membered cycloheteroalkyl group, and q) a —Y-5-14 membered heteroaryl group, wherein each of the $C_{1-40}$ alkyl group, the $C_{2-40}$ alkenyl group, the $C_{2-40}$ alkynyl group, the $C_{3-10}$ cycloalkyl group, the $C_{6-14}$ aryl group, the $C_{6-14}$ haloaryl group, the 3-12 membered cycloheteroalkyl group, and the 5-14 membered heteroaryl group is optionally substituted with 1-4 $R^g$ groups; and $R^g$, at each occurrence, is independently selected from a) halogen, b) —CN, c) —NO$_2$, d) oxo, e) —OH, f) —NH$_2$, g) —NH(C$_{1-20}$alkyl), h) —N(C$_{1-20}$alkyl)$_2$, i) —N(C$_{1-20}$alkyl)—C$_{6-14}$aryl, j) —N(C$_{6-14}$aryl)$_2$, —S(O)$_w$H, l) —S(O)$_w$—C$_{1-20}$alkyl, m) —S(O)$_2$OH, n) —S(O)$_w$—OC$_{1-20}$ alkyl, o) —S(O)$_w$—OC$_{6-14}$aryl, p) —CHO, q) —C(O)—C$_{1-20}$alkyl, r) —C(O)—C$_{6-14}$aryl, s) —C(O)OH, t) —C(O)—OC$_{1-20}$alkyl, u) —C(O)—OC$_{6-14}$aryl, v) —C(O)NH$_2$, w) —C(O)NH—C$_{1-20}$alkyl, x) —C(O)N(C$_{1-20}$alkyl)$_2$, y) —C(O)NH—C$_{6-14}$aryl, z) —C(O)N(C$_{1-20}$alkyl)—C$_{6-14}$aryl, aa) —C(O)N(C$_{6-14}$aryl)$_2$, ab) —C(S)NH$_2$, ac) —C(S)NH—C$_{1-20}$alkyl, ad) —C(S)N(C$_{1-20}$alkyl)$_2$, ae) —C(S)N(C$_{6-14}$aryl)$_2$, af) —C(S)N(C$_{1-20}$alkyl)—C$_{6-14}$aryl, ag) —C(S)NH—C$_{6-14}$aryl, ah) —S(O)$_w$NH$_2$, ai) —S(O)$_w$NH(C$_{1-20}$alkyl), aj) —S(O)$_w$N(C$_{1-20}$alkyl)$_2$, ak) —S(O)$_w$NH(C$_{6-14}$aryl), al) —S(O)$_w$N(C$_{1-20}$alkyl)—C$_{6-14}$aryl, am) —S(O)$_w$N(C$_{6-14}$aryl)$_2$, an) —SiH$_3$, ao) —SiH(C$_{1-20}$alkyl)$_2$, ap) —SiH$_2$(C$_{1-20}$alkyl), aq) —Si(C$_{1-20}$ alkyl)$_3$, ar) a $C_{1-20}$alkyl group, as) a $C_{2-20}$alkenyl group, at) a $C_{2-20}$alkynyl group, au) a $C_{1-20}$alkoxy group, av) a $C_{1-20}$alkylthio group, aw) a $C_{1-20}$haloalkyl group, ax) a $C_{3-10}$cycloalkyl group, ay) a $C_{6-14}$aryl group, az) a $C_{6-14}$haloaryl group, ba) a 3-12 membered cycloheteroalkyl group, and bb) a 5-14 membered heteroaryl group;

Y, at each occurrence, is independently selected from a divalent $C_{1-6}$alkyl group, a divalent $C_{1-6}$haloalkyl group, and a covalent bond; and w is 0, 1, or 2.

In some embodiments, π-2 can be selected from:

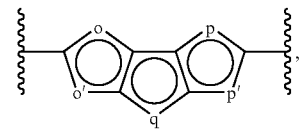

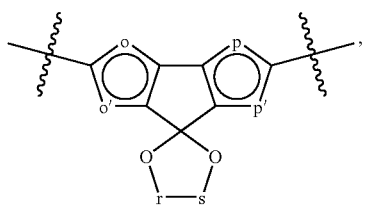

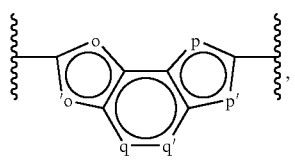

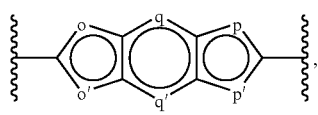

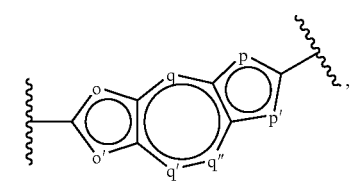

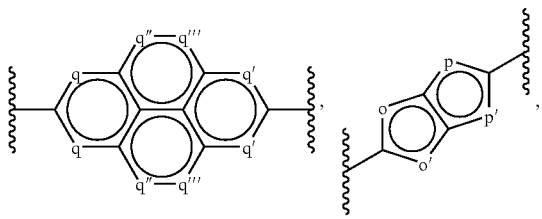

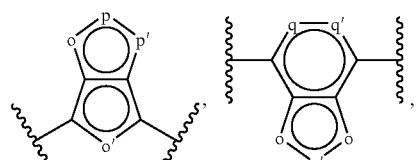

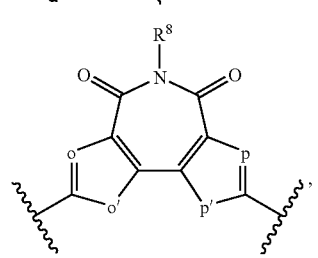

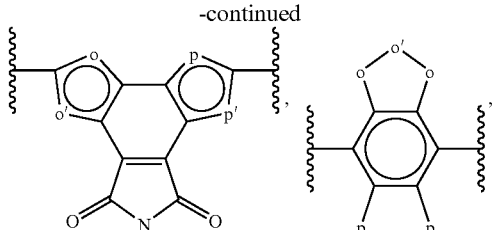

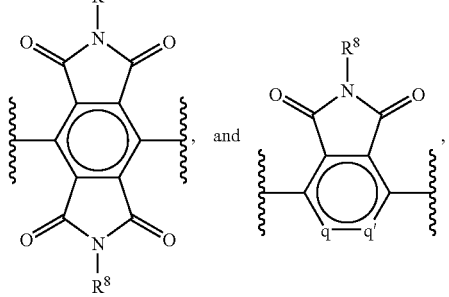

wherein:

q, q', q" and q''' independently can be selected from —$CR^8$=, =$CR^8$—, —C(O)—, and —C(C(CN)$_2$)—;

o, o', p and p' independently can be selected from —$CR^8$=, =$CR^8$—, —C(O)—, —C(C(CN)$_2$)—, —S—, —N=, =N—, —$SiR^8$=, =$SiR^8$—, —$SiR^8R^8$—, and —$CR^8$=$CR^8$—;

r and s independently can be —$CR^8R^8$— and —C(C(CN)$_2$)—; and $R^8$, at each occurrence, can be independently H or $R^f$.

In various embodiments, π-2 can have a reduction potential greater than (i.e., more positive than) −2.6 V. In certain embodiments, π-2 can have a reduction potential greater than or equal to about −2.2 V. In particular embodiments, π-2 can have a reduction potential greater than or equal to about −1.2 V. In particular embodiments, π-2 can include at least one electron-withdrawing group. For example, π-2 can include one or more electron-withdrawing groups independently selected from a carbonyl group, a cyano group, and a dicyanovinylidenyl group. In some embodiments, π-2 can be a polycyclic moiety including a monocyclic ring (e.g., a 1,3-dioxolane group or a derivative thereof including optional substituents and/or ring heteroatoms) covalently bonded to a second monocyclic ring or a polycyclic system via a spiroatom (e.g., a Spiro carbon atom).

In some embodiments, π-2 can be selected from:

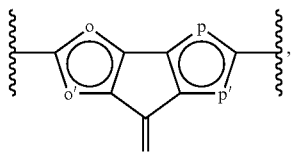

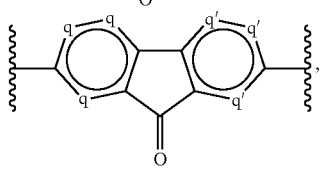

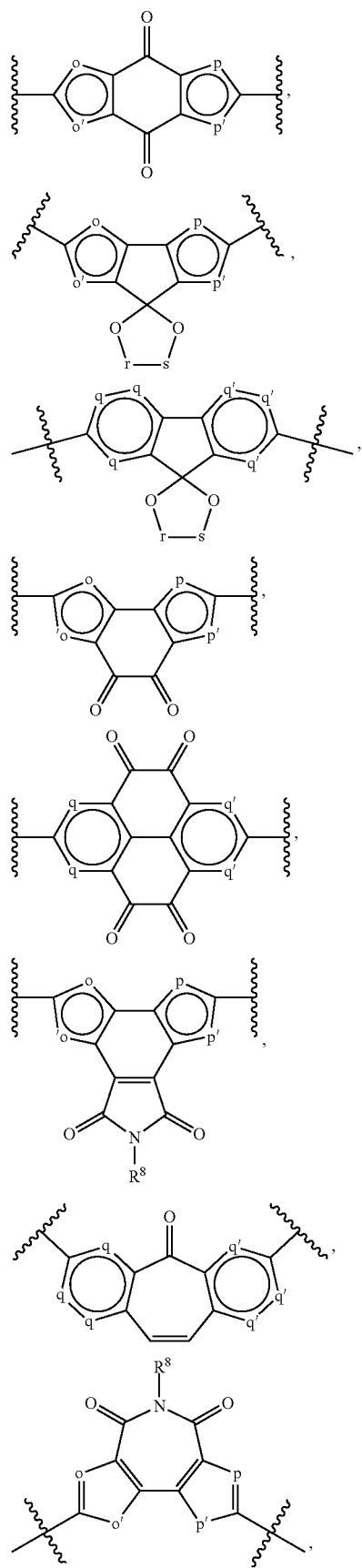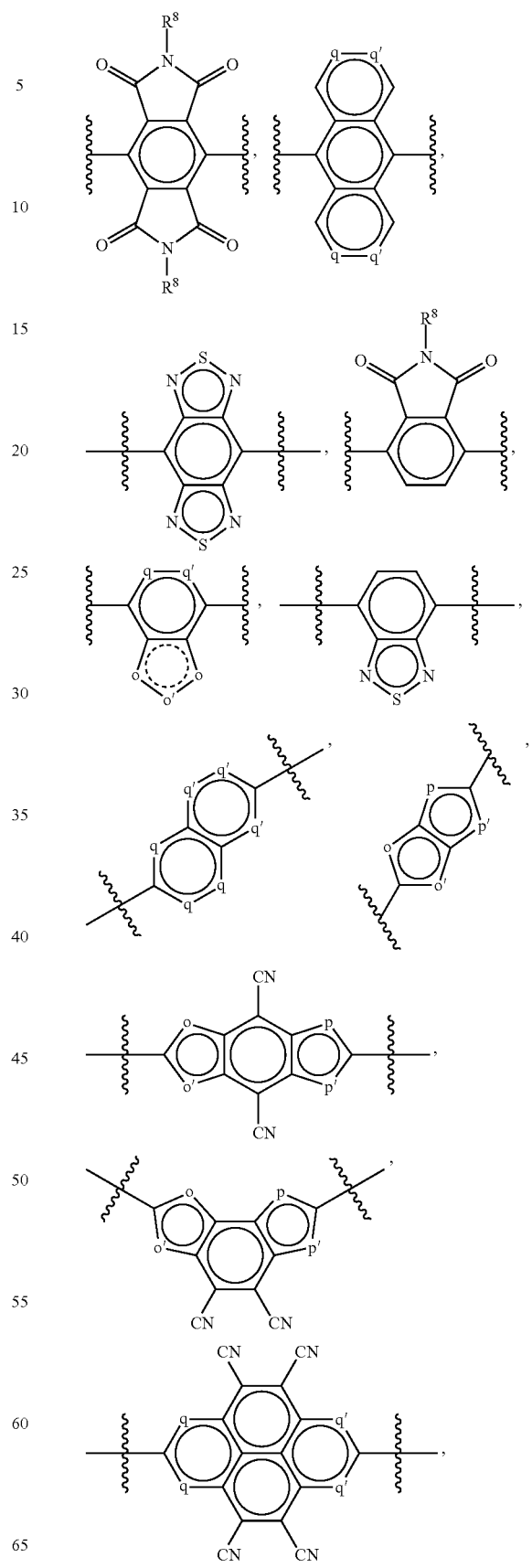

-continued

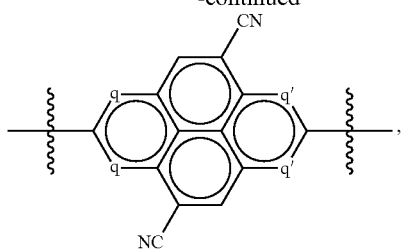

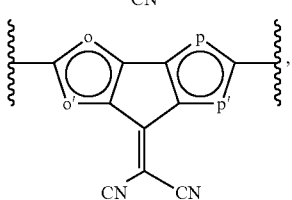

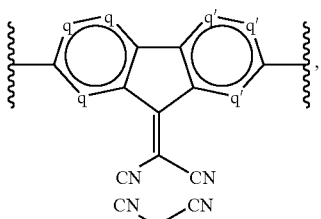

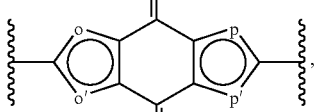

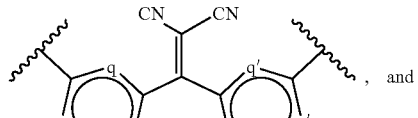

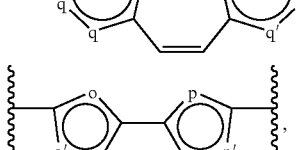

wherein o, o', p, p', q, q', r, s, and $R^8$ are as defined herein. For example, each of o, o', p, and p' can be —S—, —$CR^8$=, =$CR^8$—, —$SiR^8$=, and =$SiR^8$—; each of q and q' can be —$CR^8$=, =$CR^8$—, —N=, and =N—; and each of r and s can be $CR^8R^8$; where $R^8$, at each occurrence, can be independently selected from H, a halogen, —CN, a $C_{1-40}$ alkyl group, a $C_{1-40}$ alkoxy group, and a $C_{1-40}$ haloalkyl group.

In certain embodiments, π-2 can be selected from:

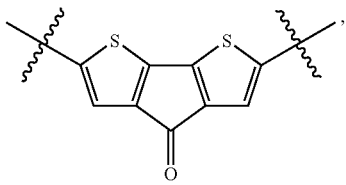

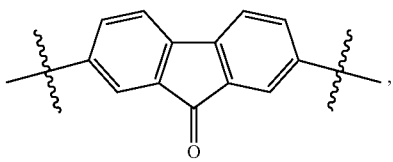

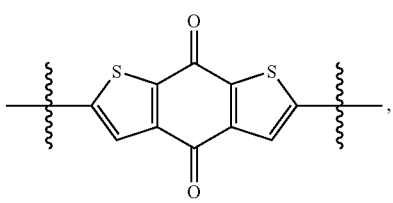

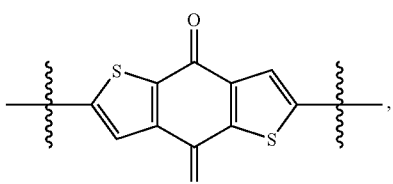

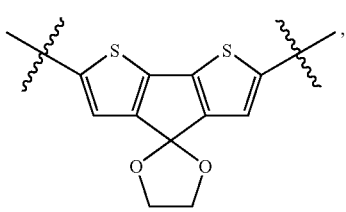

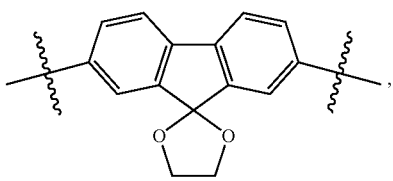

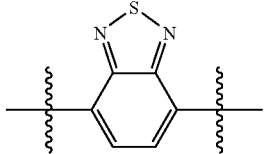

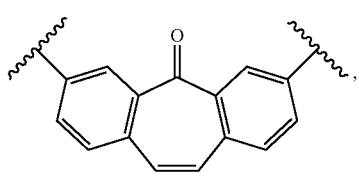

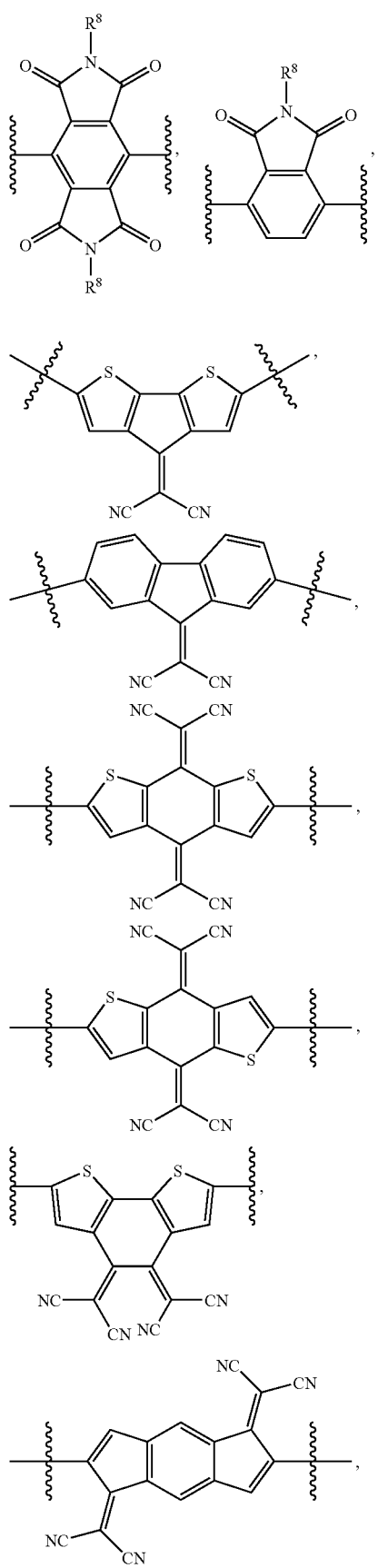

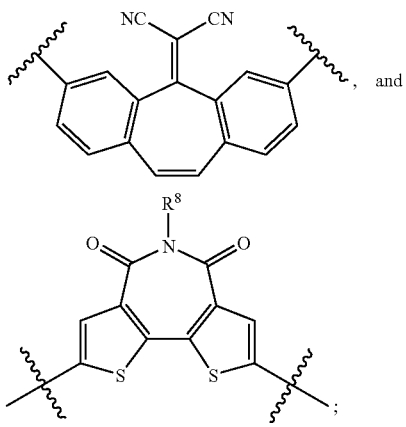

where R⁸ is as defined herein.

In some embodiments, $M_2$ can be $(Ar)_m$, wherein Ar and m are as defined herein. Accordingly, the present polymers can have a formula selected from:

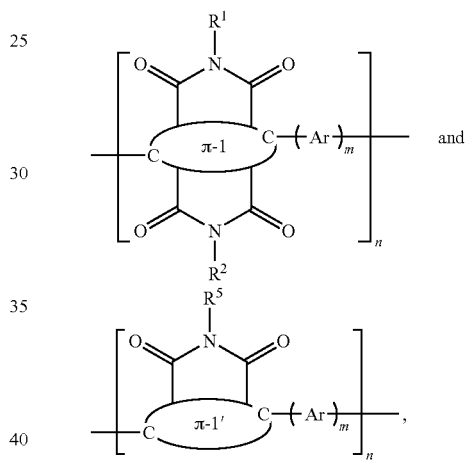

wherein π-1, π-1', Ar, $R^1$, $R^2$, $R^5$, m, and n are as defined herein.

In certain embodiments, polymers of the present teachings can include one or more repeating units (and the regioisomers thereof) selected from:

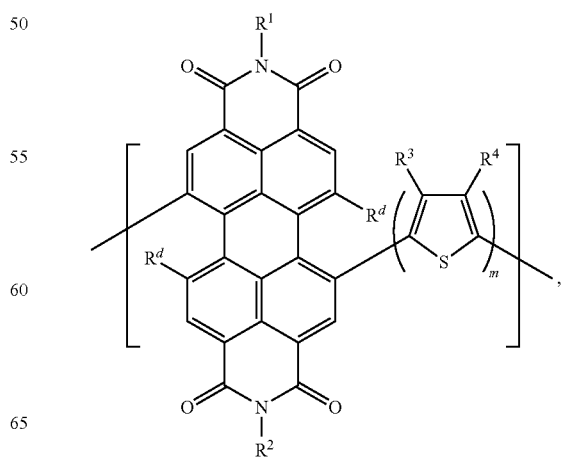

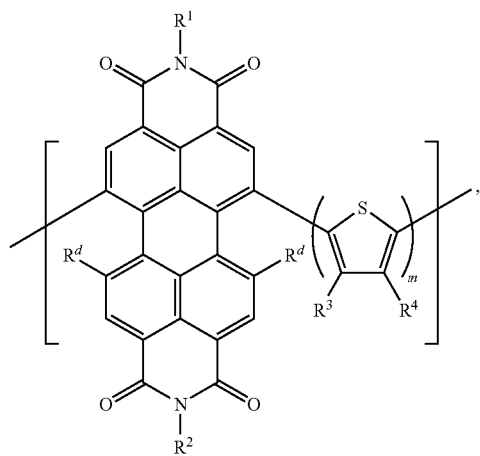
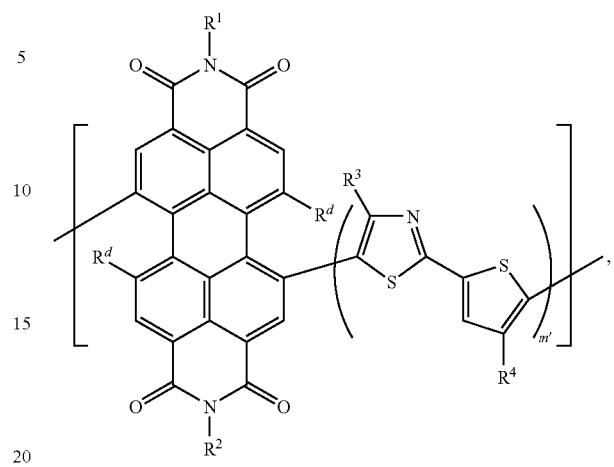
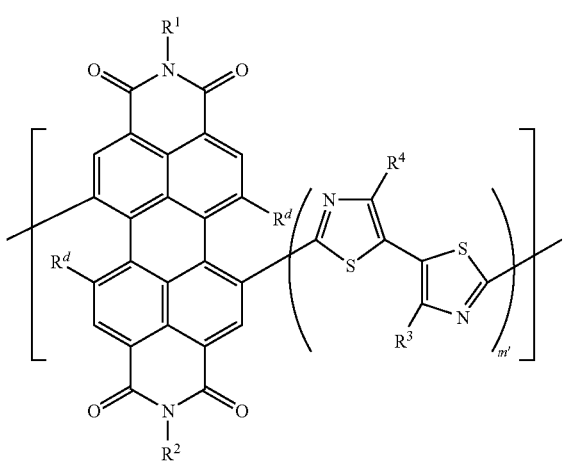
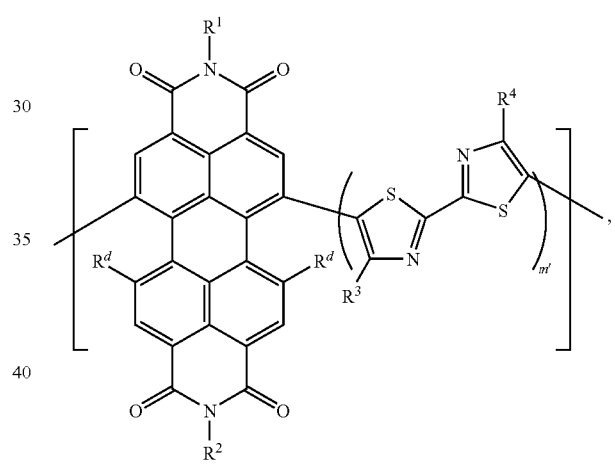
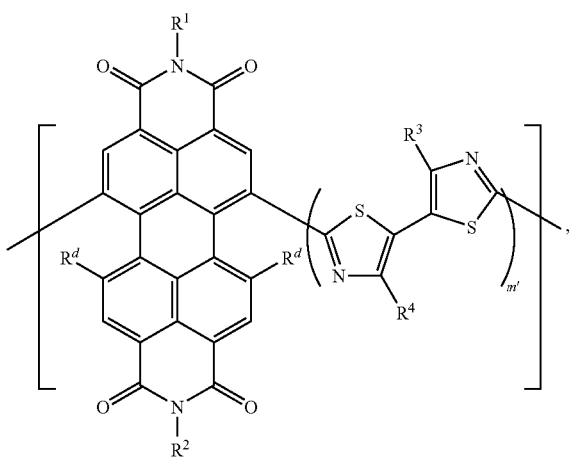
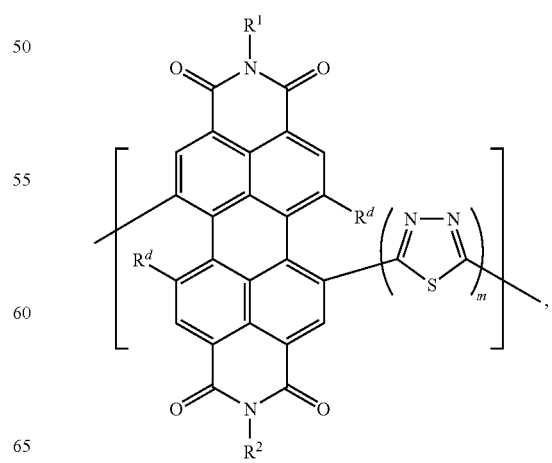

31
-continued
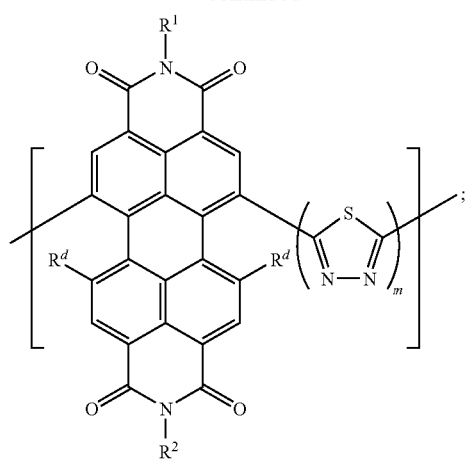
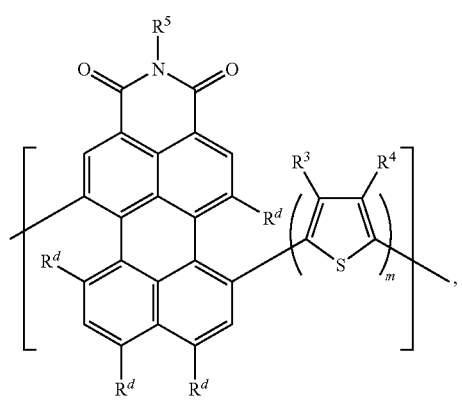
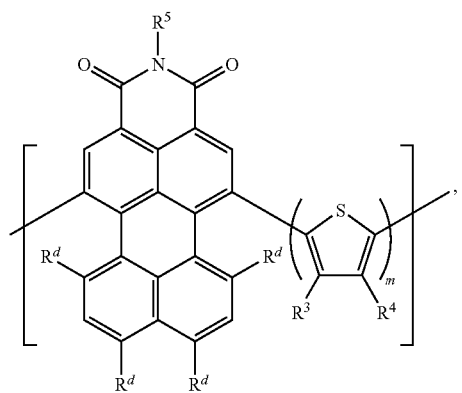
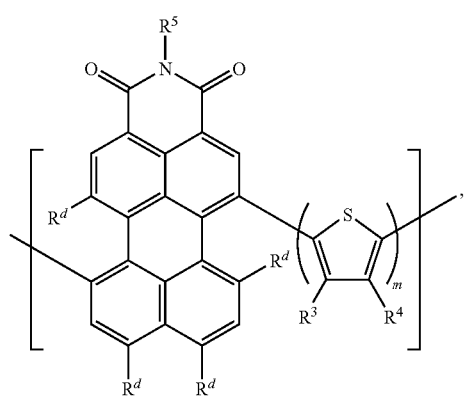
32
-continued
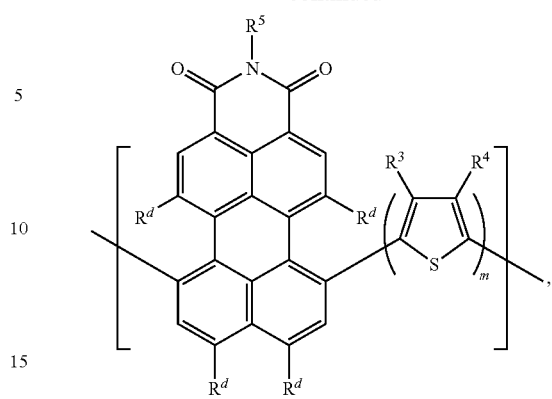
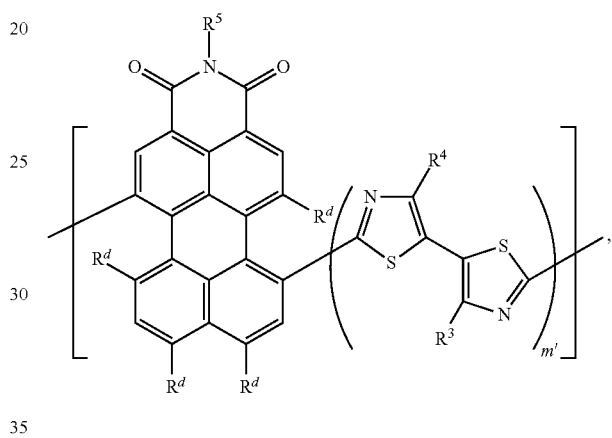
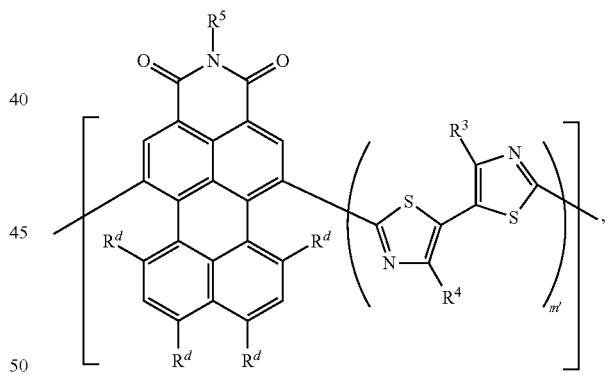
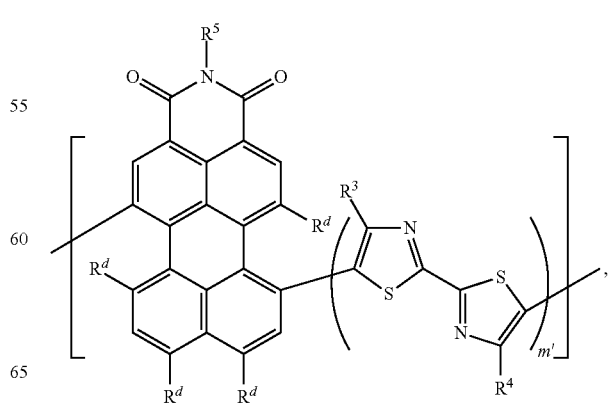

33
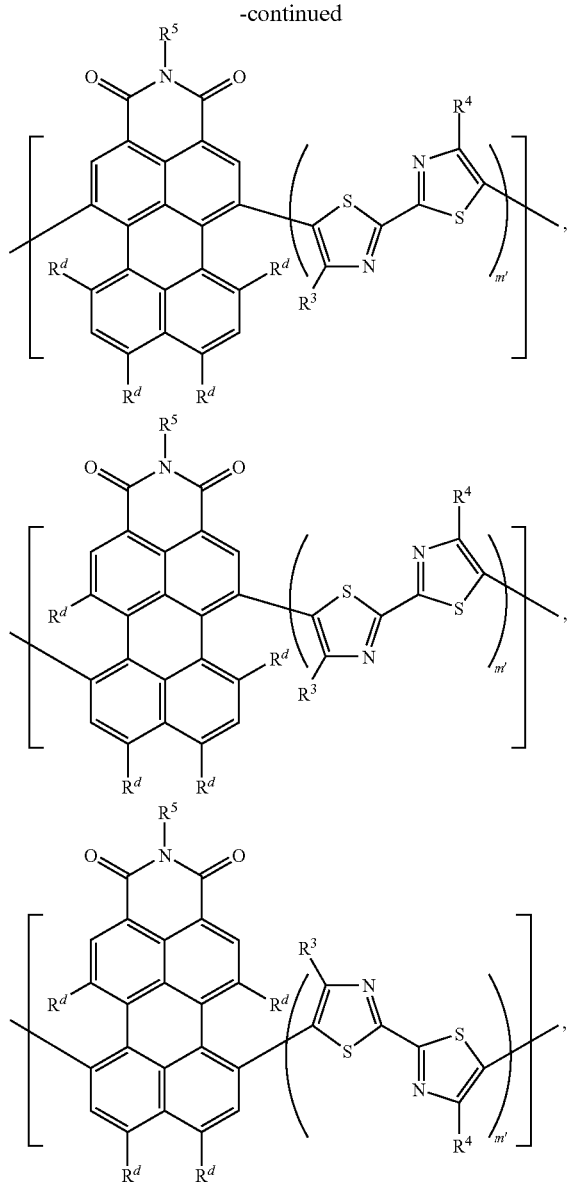
34
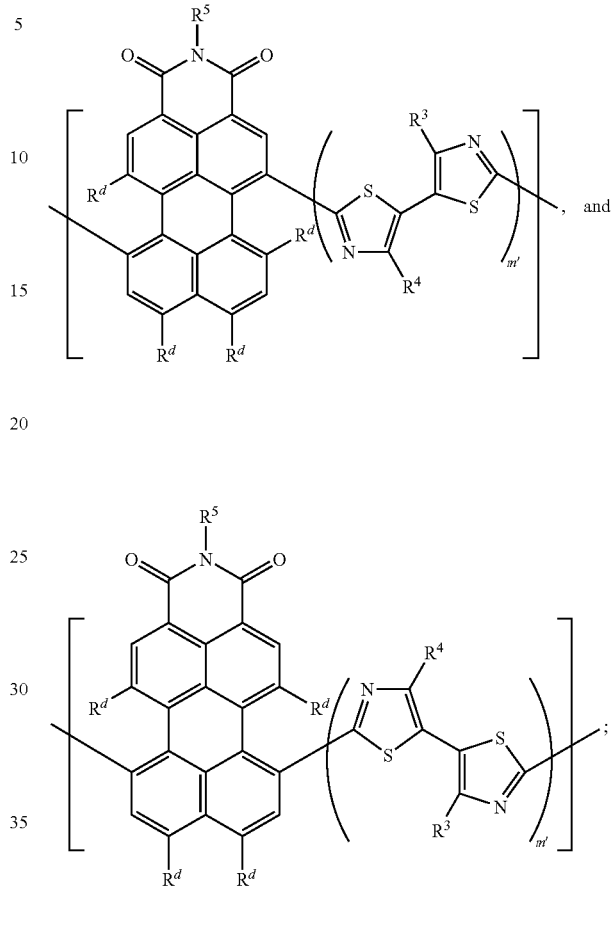
where R¹, R², R³, R⁴, R⁵, $R^d$, m and m' are as defined herein. For example, m can be 1, 2, 4, and 6; and m' can be 1, 2, or 3.
Accordingly, in some embodiments, the present polymers can be represented by a formula selected from:
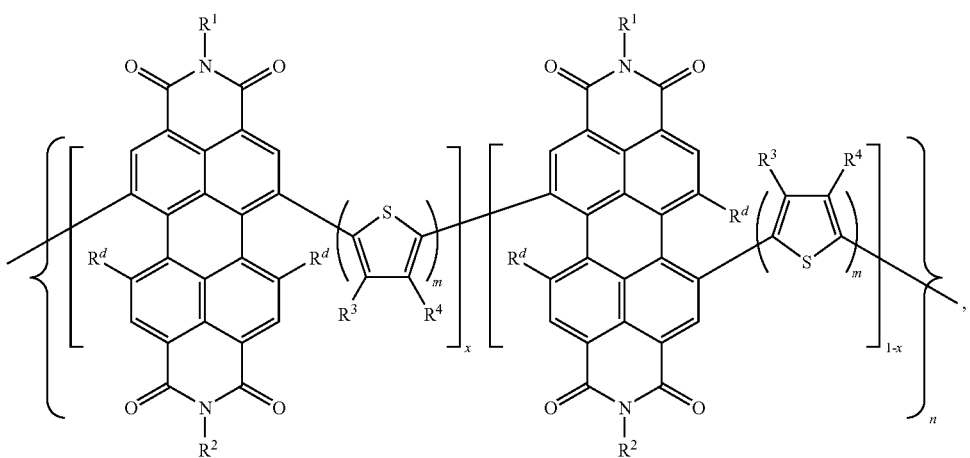

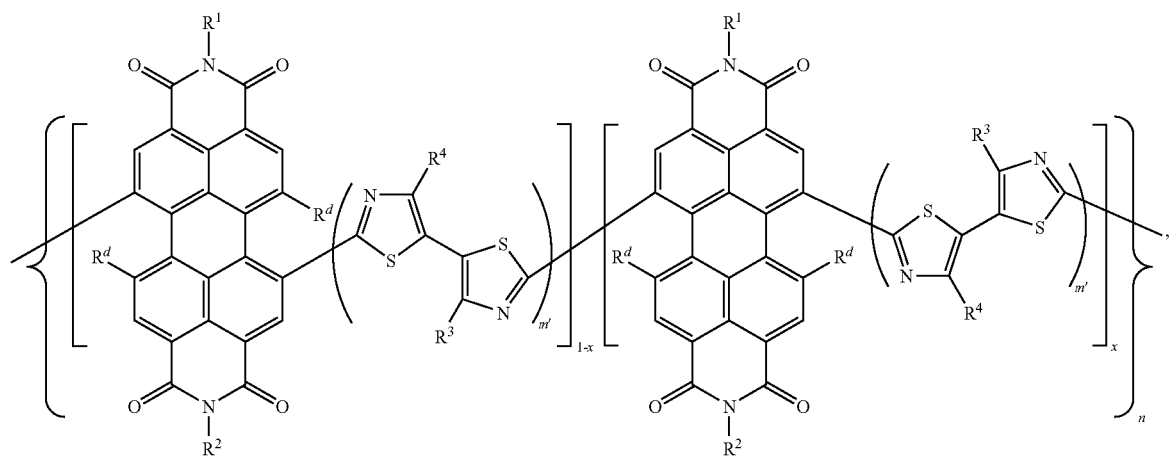
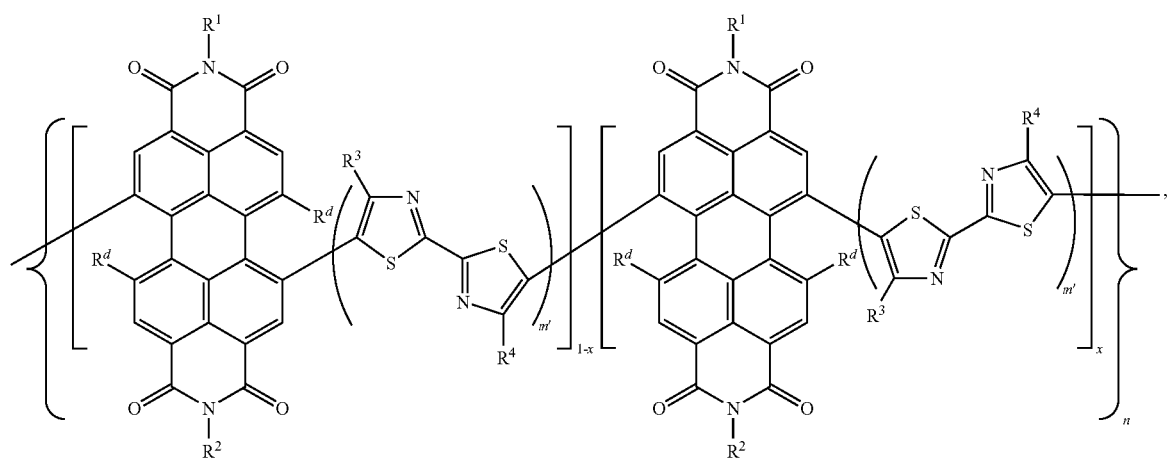
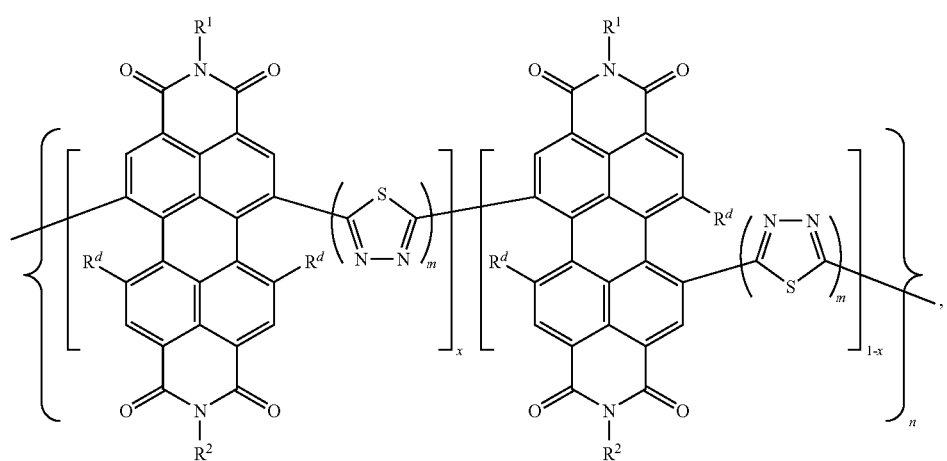

-continued
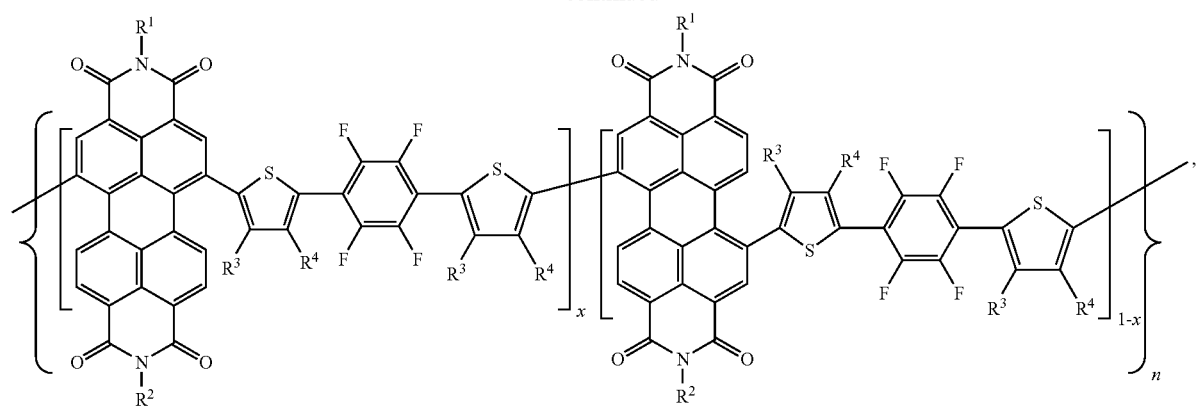
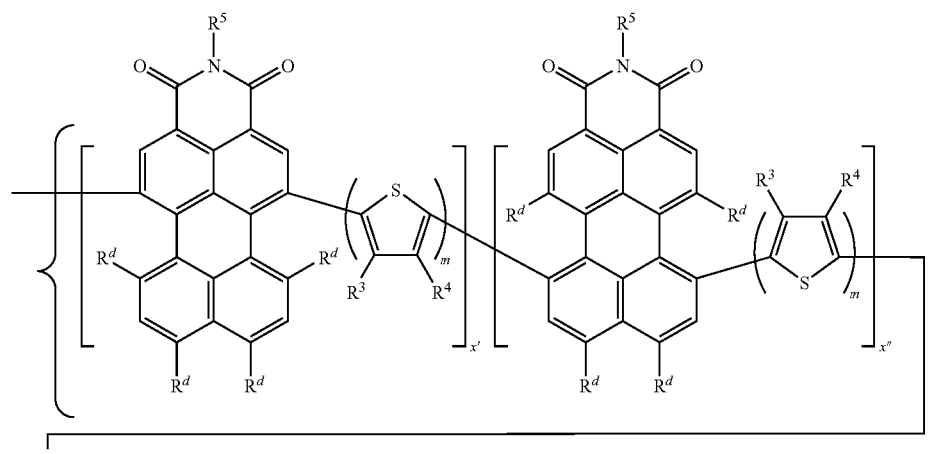
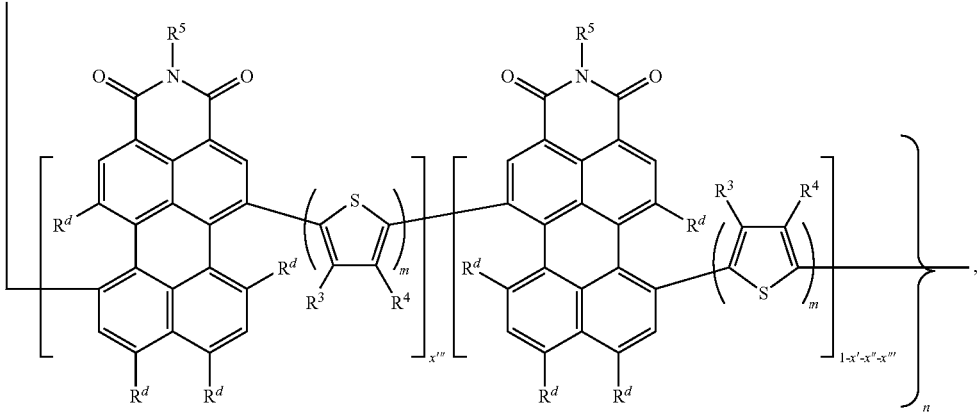
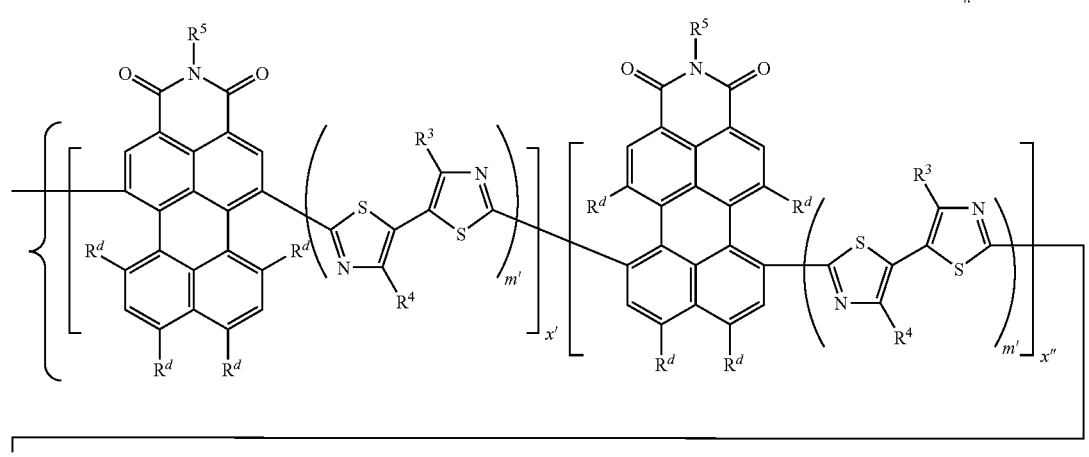

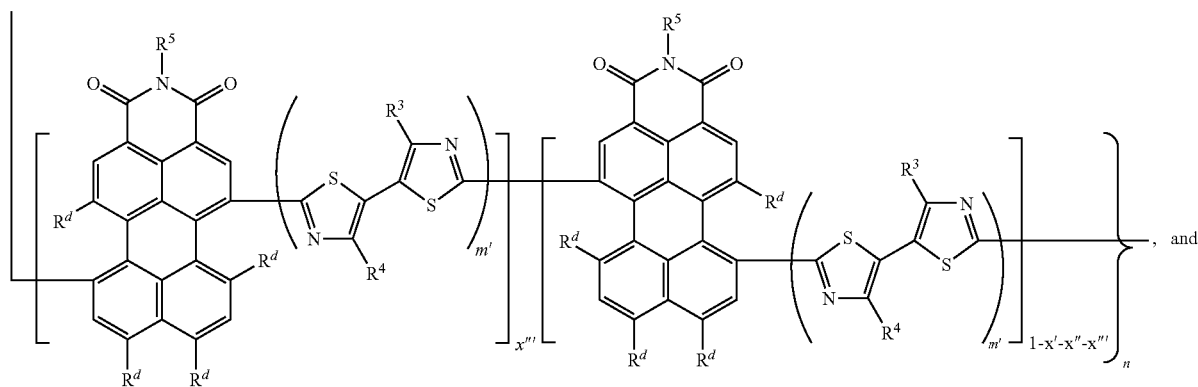
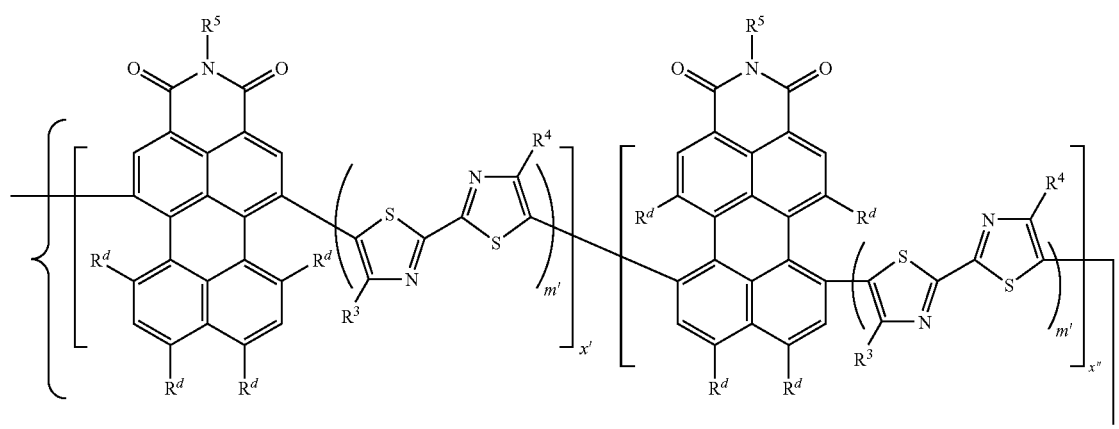
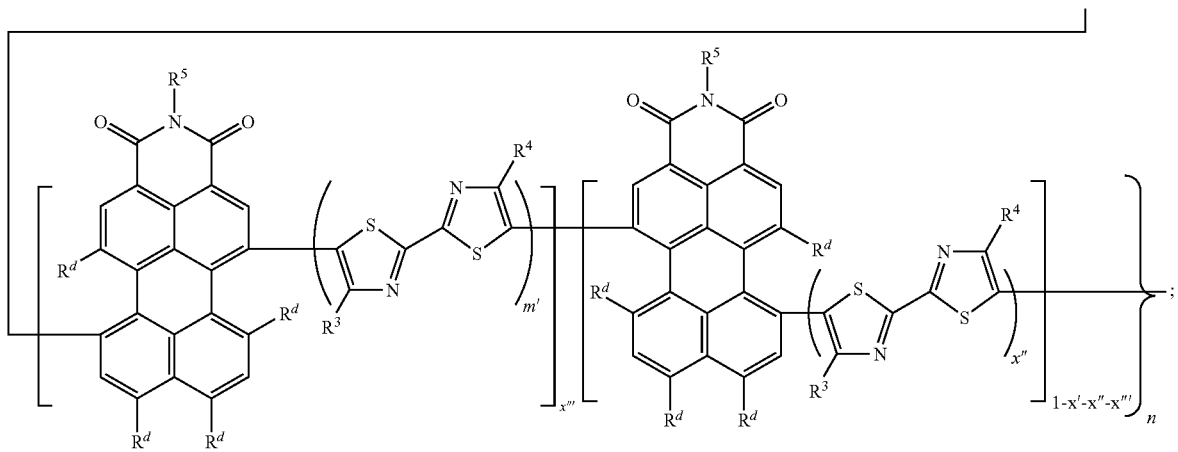

wherein:
x is a real number and 0≤x≤1;
x', x", and x''' are real numbers and 0≤x'+x"+x'''≤1; and
$R^1$, $R^2$, $R^3$, $R^4$, $R^5$, $R^d$, m, m', and n are as defined herein.
In certain embodiments, the present polymers can have a formula selected from:
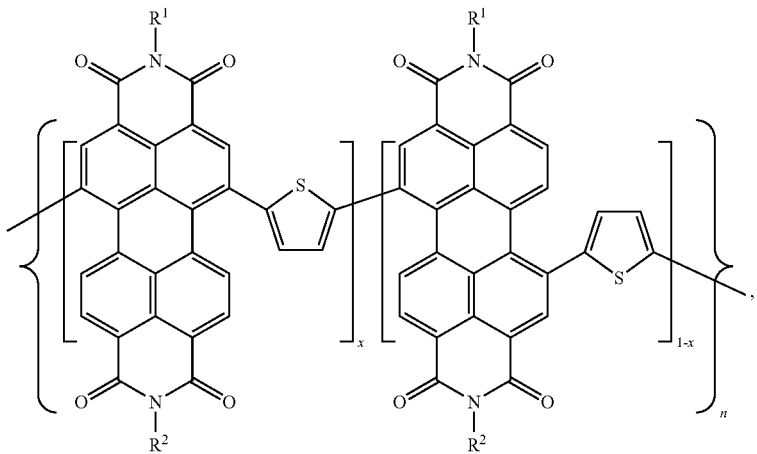
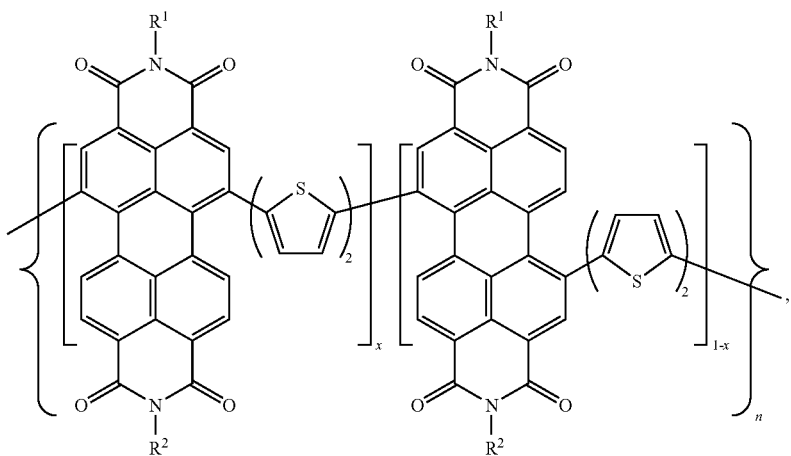
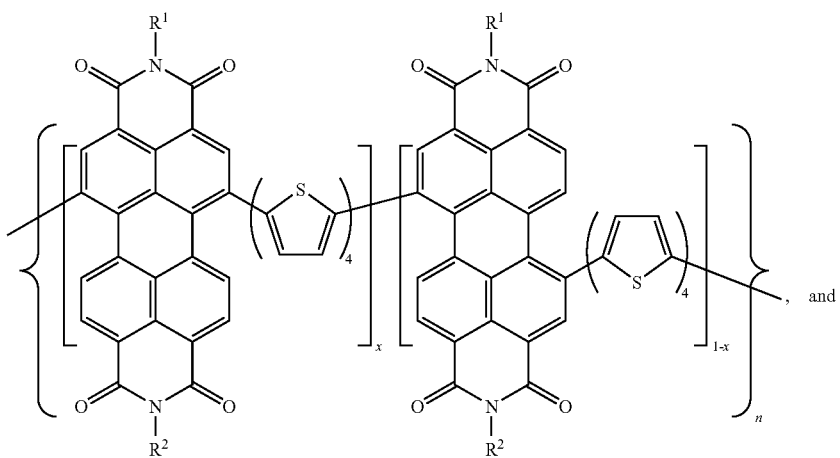
, and

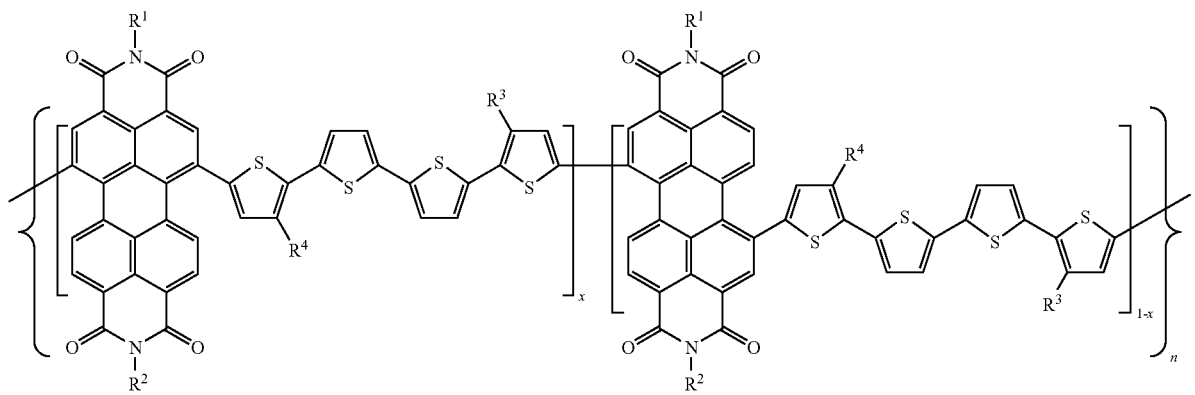

wherein x is a real number and 0≤x<1; and $R^1$, $R^2$, $R^3$, $R^4$, and n are as defined herein.

In some embodiments, $M_2$, in addition to the one or more optionally substituted monocyclic aryl or heteroaryl group, can include a linker. For example, $M_2$ can have the formula:

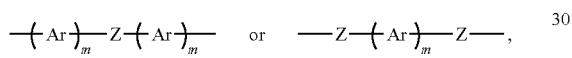

wherein m is selected from 1, 2, 4, or 6; and Ar and Z are as defined herein. In certain embodiments, $M_2$ can be selected from:

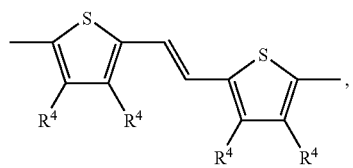

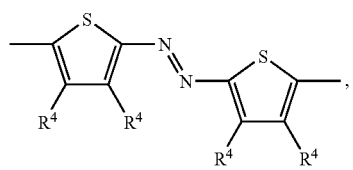

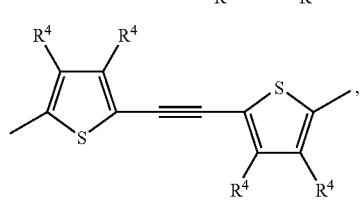

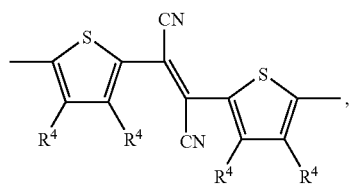

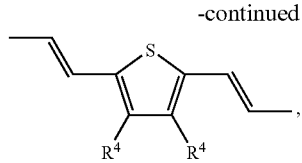

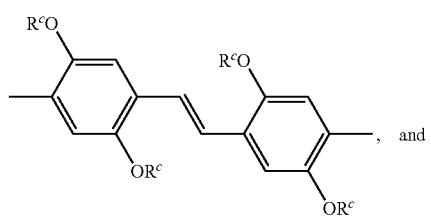

, and

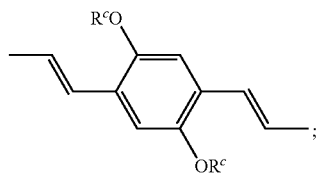

;

wherein $R^4$ and $R^c$ are as defined herein.

In some embodiments, $M_2$, in addition to the one or more optionally substituted monocyclic aryl or heteroaryl group, can include one or more optionally substituted polycyclic moieties. For example, $M_2$ can have the formula:

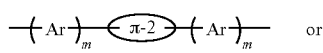

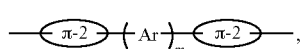

wherein m is selected from 1, 2, 4, or 6; and Ar and π-2 are as defined herein. In certain embodiments, $M_2$ can be selected from:

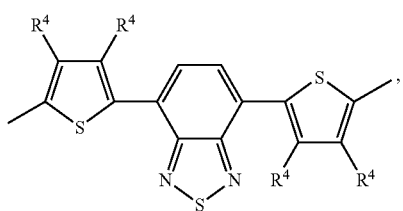
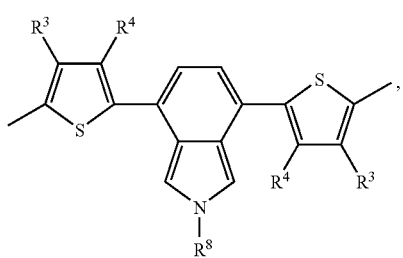
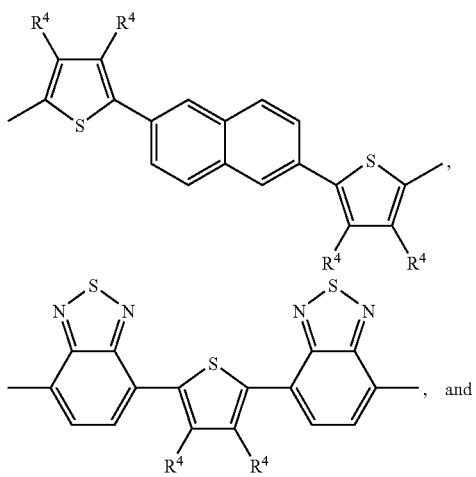
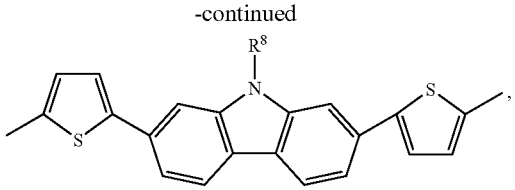
wherein $R^3$, $R^4$ and $R^8$ are as defined herein.
In a some embodiments, the present polymers can have a formula selected from:
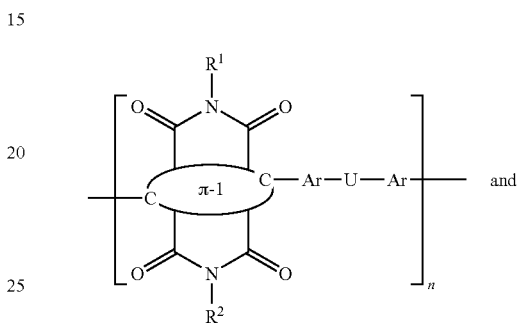
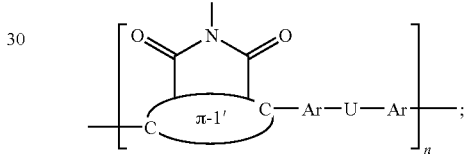
wherein U is Z or π-2; and π-1, π1', π-2, Ar, $R^1$, $R^2$, $R^5$, Z, and n are as defined herein.
In certain embodiments, the present polymers can have a formula selected from:
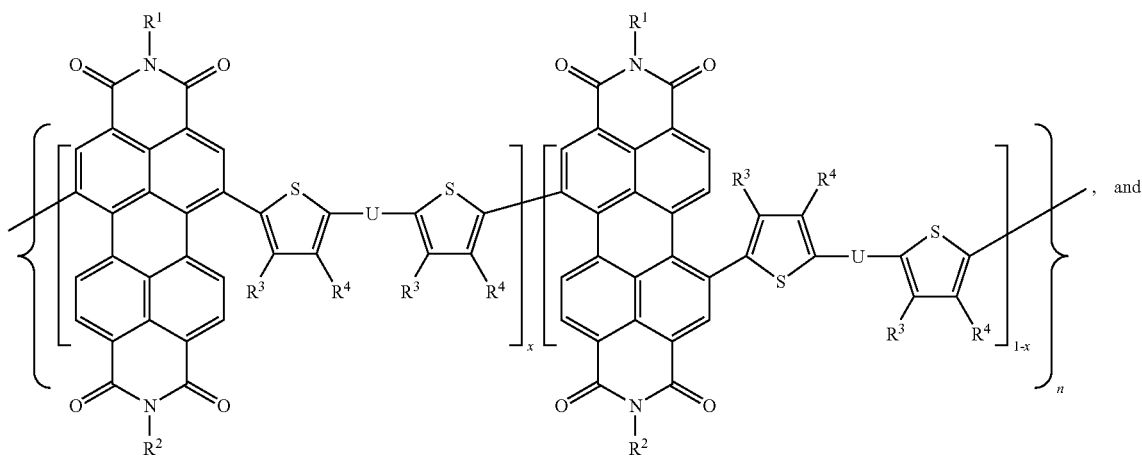

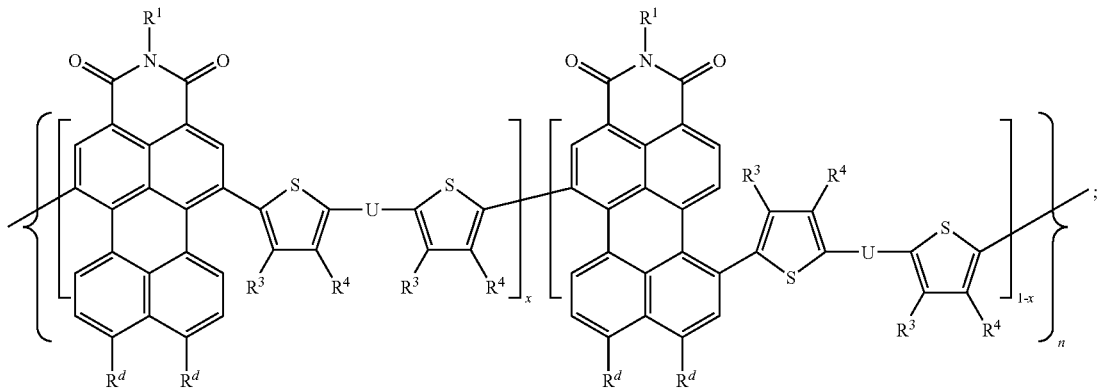
wherein $R^1$, $R^2$, $R^3$, $R^4$, $R^5$, $R^d$, U, x, and n are as defined herein.
For example, certain embodiments of the present formula can have the formula:
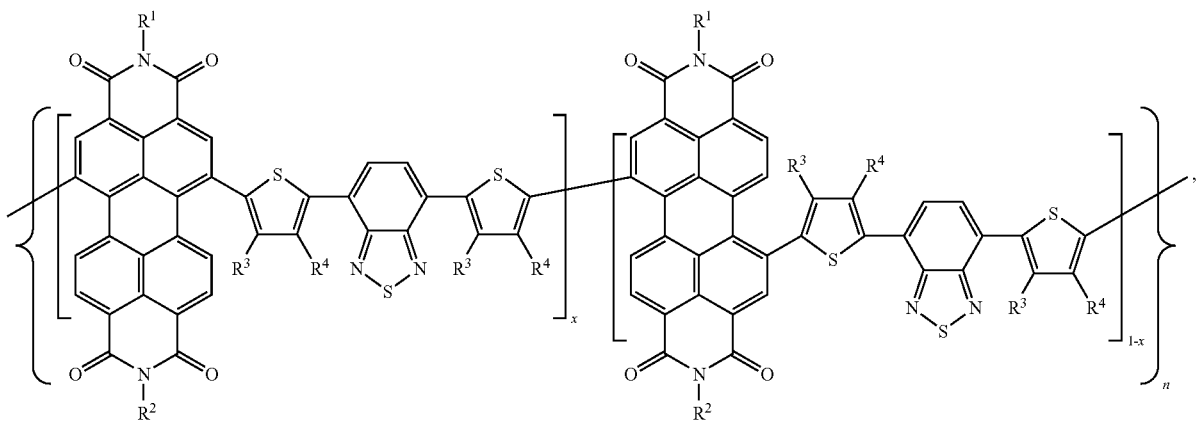
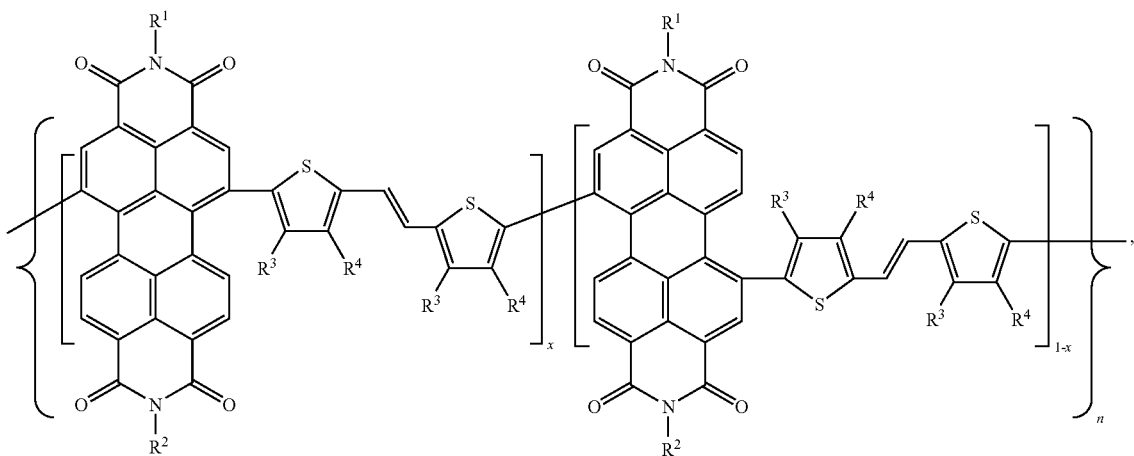

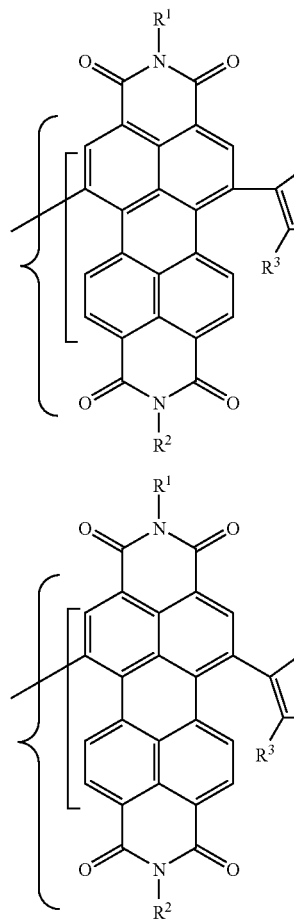
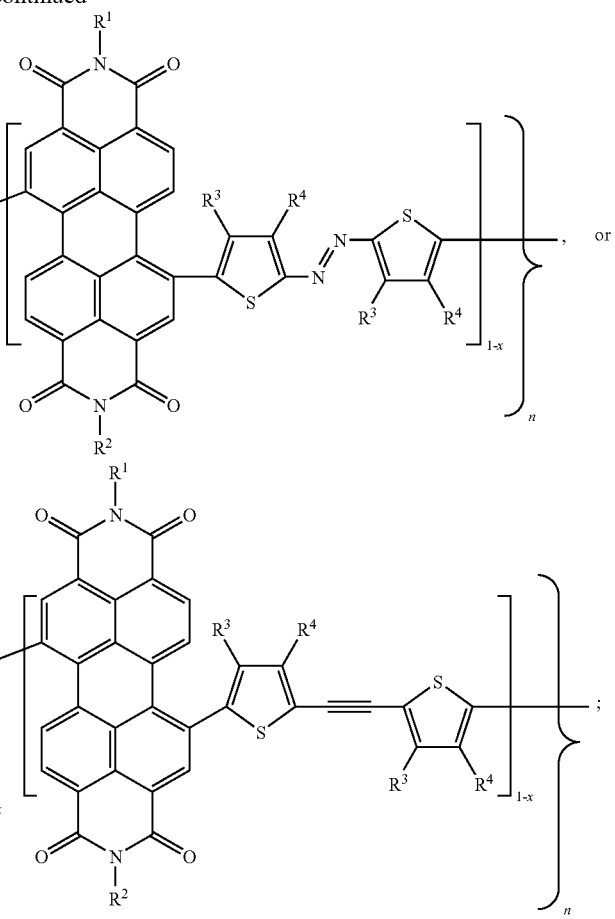

wherein $R^1$, $R^2$, $R^3$, $R^4$, x, and n are as defined herein.

Other embodiments of the present polymers include $M_2$ selected from:

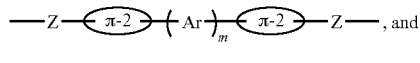, and

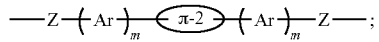;

where m, at each occurrence, independently can be 1, 2, 3 or 4; and Ar, π-2 and Z are as defined herein. In certain embodiments, $M_2$ can be selected from:

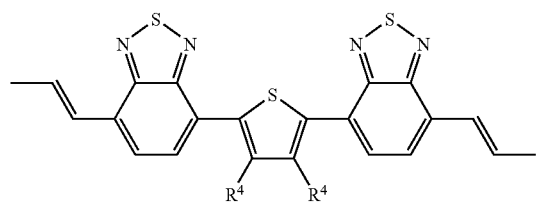
and

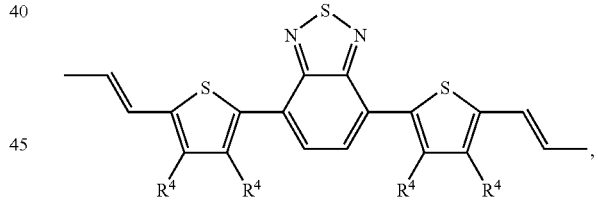

wherein $R^4$ is as defined herein.

The polymers of the present teachings typically are substituted at the imide position(s). The substituents can be selected according to, for example, their ability to modify the solubility of the polymers among other considerations described above. Accordingly, in some embodiments, $R^1$, $R^2$, and $R^5$ independently can be selected from H, a $C_{1-40}$ alkyl group, a $C_{2-40}$ alkenyl group, a $C_{2-40}$ alkynyl group, a $C_{1-40}$ haloalkyl group,
-L-$R^a$, -L-$Ar^1$, -L-$Ar^1$—$Ar^1$, -L-$Ar^1R^a$, -L-$Ar^1Ar^1$—$R^a$, -L-$Cy^1$, -L-$Cy^1Cy^1$, -L-$Cy^1$-$R^a$, and -L-$Cy^1$-$Cy^1$-$R^a$;
wherein:
L, at each occurrence, is independently selected from —Y—O—Y—, —Y—[S(O)$_w$]—Y—, —Y—C(O)—Y—, —Y—[NR$^c$C(O)]—Y—, —Y—[C(O)NR$^c$]—, —Y—NR$^c$—, —Y—[SiR$^c_2$]—Y—, a divalent $C_{1-20}$ alkyl group, a divalent $C_{1-20}$ alkenyl group, a divalent $C_{1-20}$ haloalkyl group, and a covalent bond;

Ar¹, at each occurrence, is independently a monovalent or divalent $C_{6-14}$ aryl group or a 5-14 membered heteroaryl group, each optionally substituted with 1-5 substituents independently selected from a halogen, —CN, oxo, $=C(CN)_2$, a $C_{1-6}$ alkyl group, a $C_{1-6}$ alkoxy group, and a $C_{1-6}$ haloalkyl group;

Cy¹, at each occurrence, is independently a monovalent or divalent $C_{3-14}$ cycloalkyl group or a 3-14 membered cycloheteroalkyl group, each optionally substituted with 1-5 substituents independently selected from a halogen, —CN, oxo, $=C(CN)_2$, a $C_{1-6}$ alkyl group, a $C_{1-6}$ alkoxy group, and a $C_{1-6}$ haloalkyl group; and $R^a$, at each occurrence, is independently selected from a $C_{1-40}$ alkyl group, a $C_{2-40}$ alkenyl group, a $C_{2-40}$ alkynyl group, a $C_{1-40}$ haloalkyl group, a $C_{1-40}$ alkoxy group, -L'-$R^b$, -L'-Ar², -L'Ar²—Ar², -L'-Ar²—$R^b$, -L'-Ar²—Ar²—$R^b$, -L'-Cy², -L'-Cy¹-Cy², -L'-Cy²-$R^b$, -L'-Cy²-Cy²-$R^b$;

wherein:

L', at each occurrence, is independently selected from —Y—O—Y—, —Y—[S(O)$_w$]—Y—, —Y—C(O)—Y—, —Y—[NR$^c$C(O)]—Y—, —Y—[C(O)NR$^c$]—, —Y—NR$^c$—, —Y—[SiR$^c_2$]—Y—, a divalent $C_{1-20}$ alkyl group, a divalent $C_{1-20}$ alkenyl group, a divalent $C_{1-20}$ haloalkyl group, and a covalent bond;

Ar², at each occurrence, is independently a monovalent or divalent $C_{6-14}$ aryl group or a 5-14 membered heteroaryl group, each optionally substituted with 1-5 substituents independently selected from halogen, —CN, oxo, $=C(CN)_2$, a $C_{1-6}$ alkyl group, a $C_{1-6}$ alkoxy group, and a $C_{1-6}$ haloalkyl group;

Cy², at each occurrence, is independently a monovalent or divalent $C_{3-14}$ cycloalkyl group or a 3-14 membered cycloheteroalkyl group, each optionally substituted with 1-5 substituents independently selected from a halogen, —CN, oxo, $=C(CN)_2$, a $C_{1-6}$ alkyl group, a $C_{1-6}$ alkoxy group, and a $C_{1-6}$ haloalkyl group;

$R^b$, at each occurrence, is independently selected from a $C_{1-40}$ alkyl group, a $C_{2-40}$ alkenyl group, a $C_{2-40}$ alkynyl group, a $C_{1-40}$ haloalkyl group, and a $C_{1-40}$ alkoxy group;

$R^c$, at each occurrence, is independently selected from H, a $C_{1-6}$ alkyl group, and a —Y—$C_{6-14}$ aryl group;

Y, at each occurrence, is independently selected from a divalent $C_{1-6}$ alkyl group, a divalent $C_{1-6}$ haloalkyl group, and a covalent bond; and w is 0, 1, or 2.

For example, in the various formulae provided above, $R^1$, $R^2$ and $R^5$ can be independently selected from a linear or branched $C_{6-40}$ alkyl or alkenyl group, an arylalkyl group optionally substituted with a linear or branched $C_{6-40}$ alkyl or alkenyl group, an aryl group (e.g., a phenyl group) substituted with a linear or branched $C_{6-40}$ alkyl or alkenyl group, and a biaryl group (e.g., a biphenyl group) optionally substituted with a linear or branched $C_{6-40}$ alkyl or alkenyl group, wherein each of these groups optionally can be substituted with 1-5 halo groups (e.g., F). In some embodiments, $R^1$ can be a biaryl group wherein the two aryl groups are covalently linked via a linker (L'). For example, the linker can be a divalent $C_{1-6}$ alkyl group or a carbonyl group. In particular embodiments, $R^1$, at each occurrence, independently can be selected from:

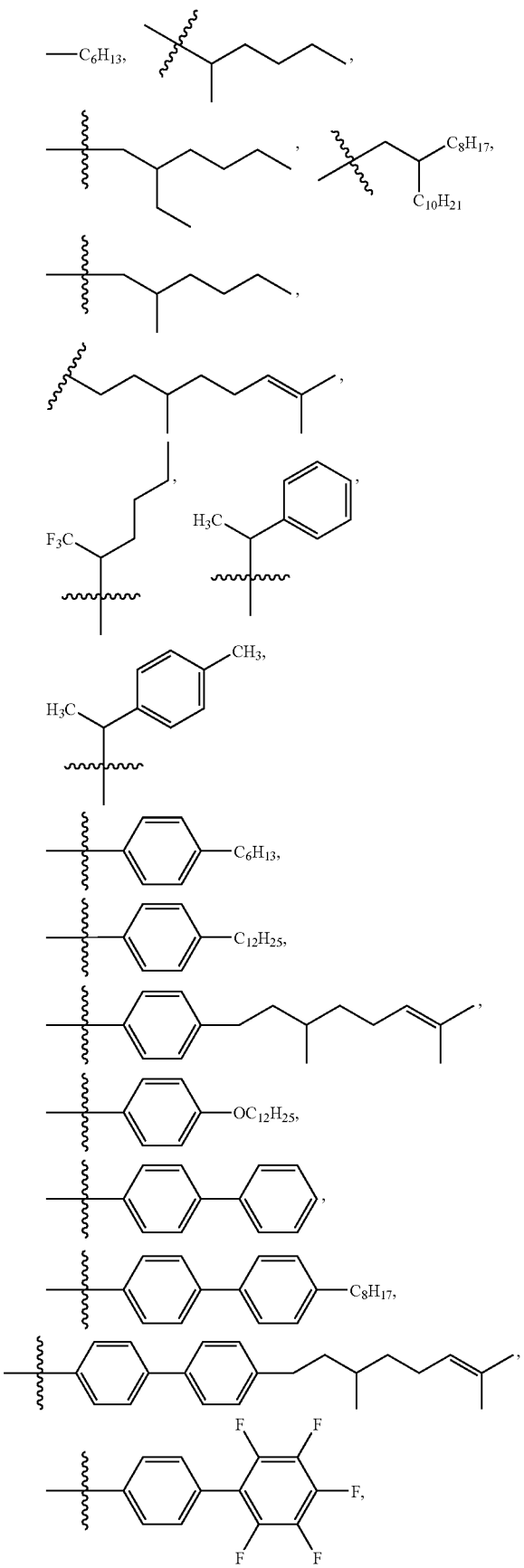

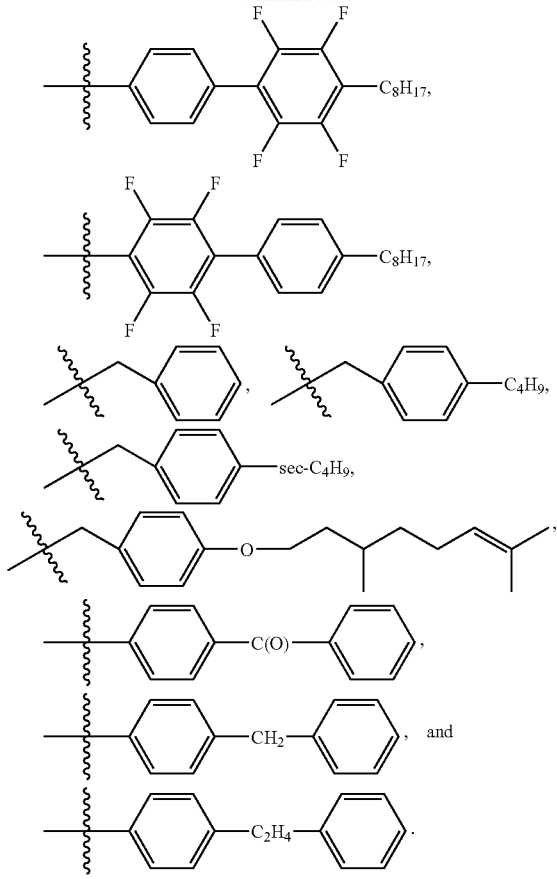

In some embodiments, substitution of alkyl chains (and similar groups such as haloalkyl groups, arylalkyl groups, heteroarylalkyl groups and so forth) on one or both imide nitrogen atoms can improve solubility of the polymer in an organic solvent. Accordingly, in certain embodiments, $R^1$, $R^2$, and $R^5$ can be a linear or branched $C_{3-40}$ alkyl group, examples of which include an n-hexyl group, a 1-methylpropyl group, a 1-methylbutyl group, a 1-methylpentyl group, a 1-methylhexyl group, a 1-ethylpropyl group, a 1-ethylbutyl group, a 1-3,dimethylbutyl group, and a 2-octyldodecyl group. In certain embodiments, $R^1$, $R^2$, and $R^5$ can be a linear or branched $C_{3-40}$ alkenyl group. In particular embodiments, $R^1$, $R^2$, and $R^5$ can be a branched $C_{3-20}$ alkyl group or a branched $C_{3-20}$ alkenyl group. For example, $R^1$, $R^2$, and $R^5$, at each occurrence, independently can be selected from the following:

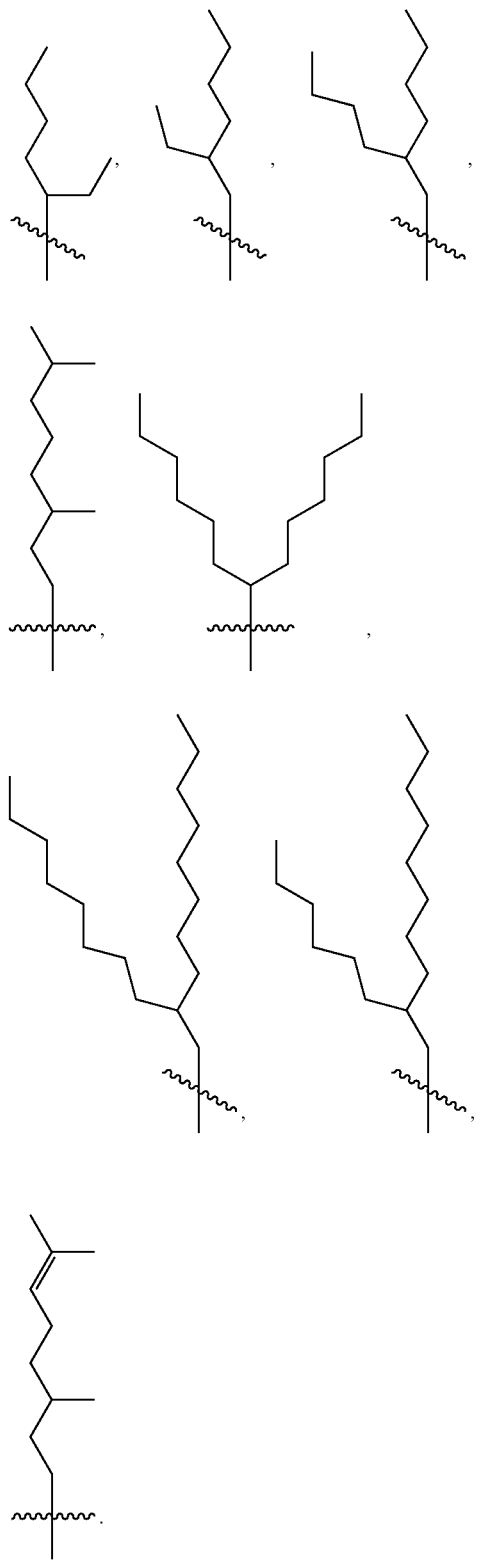

In some embodiments, $R^1$ can be an optionally substituted $C_{6-14}$ cycloalkyl group. For example, $R^1$, at each occurrence, independently can be selected from:

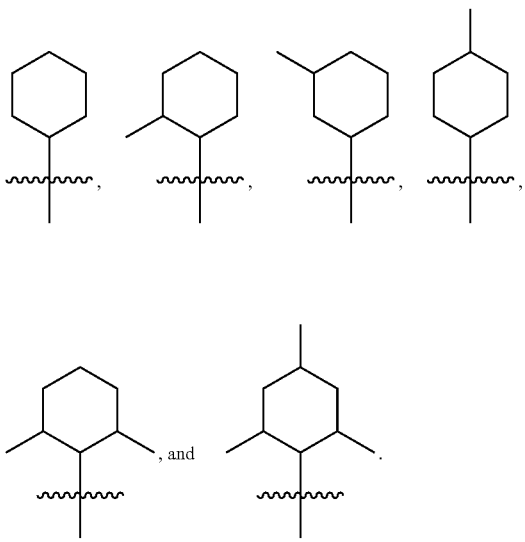

In various embodiments, the present polymers can include unsubstituted perylene moieties, i.e., $R^d$ is H. In other embodiments, the present polymers can include one or more substituted perylene moieties as described herein. For example, one or more perylene moieties can be substituted with 1-2 $R^d$ groups, where $R^d$, at each occurrence, independently can be an electron-withdrawing group or a $C_{1-30}$ alkyl group optionally substituted with 1-5 electron-withdrawing groups. For example, $R^d$ independently can be selected from halogen, —CN, and a $C_{1-10}$ haloalkyl group. In some embodiments, $R^d$, at each occurrence, independently can be selected from halogen, including F, Cl, and Br, and —CN. For example, $R^d$, at each occurrence, independently can be F, or CN.

In some embodiments, $M_2$ can include one or more unsubstituted Ar groups, i.e., $R^3$ and $R^4$ in the formulae provided above can be H. In other embodiments, $M_2$ can include one or more Ar groups which can be substituted as described herein. For example, at least one of $R^3$ and $R^4$ in the formulae provided above can be independently selected from halogen, —CN, a $C_{1-30}$ alkyl group, a $C_{1-30}$ alkoxy group, and a $C_{1-30}$ haloalkyl group. In certain embodiments, at least one of $R^3$ and $R^4$ independently can be selected from a $C_{1-30}$ alkyl group, a $C_{1-30}$ alkoxy group, and a $C_{1-30}$ haloalkyl group.

For the various polymers described above, n can be an integer in the range of 2 to 5,000. For example, n can be 2-1,000, 2-500, 2-400, 2-300, or 2-200. In certain embodiments, n can be 2-100. In some embodiments, n can be an integer between 3 and 1,000. In certain embodiments, n can be 4-1,000, 5-1,000, 6-1,000, 7-1,000, 8-1,000, 9-1,000, or 10-1,000. For example, n can be 8-500, 8-400, 8-300, or 8-200. In certain embodiments, n can be 8-100.

Compounds of the present teachings can be prepared according to procedures analogous to those described in Schemes 1 and 2 below, via a perylene intermediate that can be prepared, for example, according to intermediates described in Schemes 1 and 2, or from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the polymers described herein.

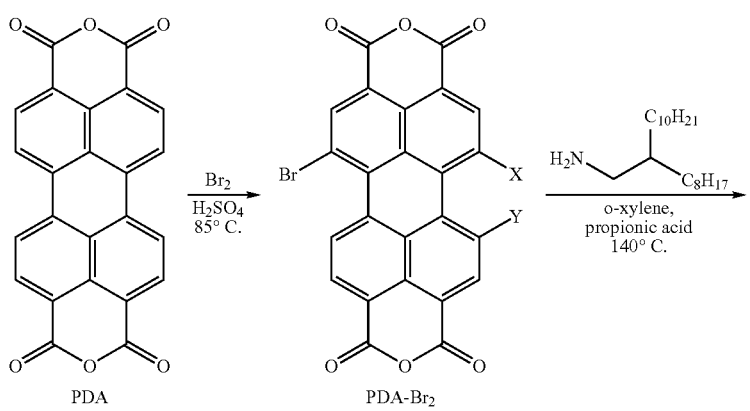

Scheme 1

-continued

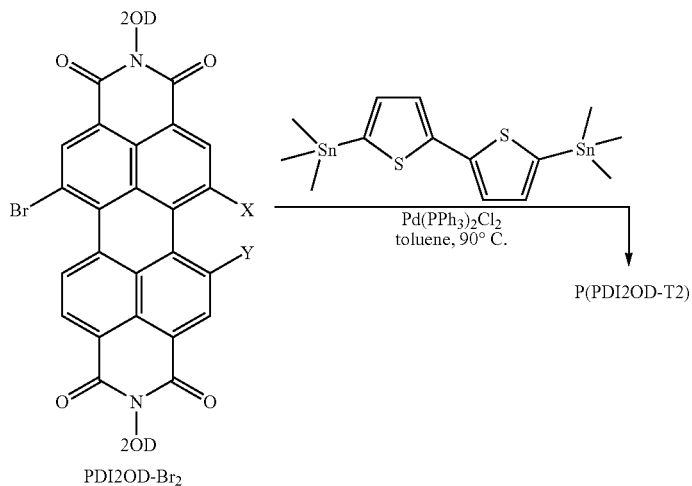

PDI2OD-Br₂

X = H, Y = Br (~70%)
X = Br, Y = H (~30%)

As shown in Scheme 1, poly{[N,N'-bis(2-octyldodecyl)-3,4:9,10-perylenediimide-(1,7&1,6)-diyl]-alt-5,5'-(2,2'-bithiophene)} (P(PDI2OD-T2)) can be synthesized via a Pd-catalyzed Stille polymerization. Specifically, (1,7&1,6)-dibromoperylene-3,4:9,10-perylenetetracarboxylic acid dianhydride (PDA-Br₂) can be prepared by bromination of 3,4:9,10-perylenetetracarboxylic acid dianhydride (PDA). PDA-Br₂ can be used for reacting with the corresponding primary amine to provide (1,7 &1,6)-dibromo-[N,N'-bis(2-octyldodecyl)-3,4:9,10-perylenediimide (PDI2OD-Br₂), which can be used for preparing P(PDI2OD-T2) in the Stille polymerization.

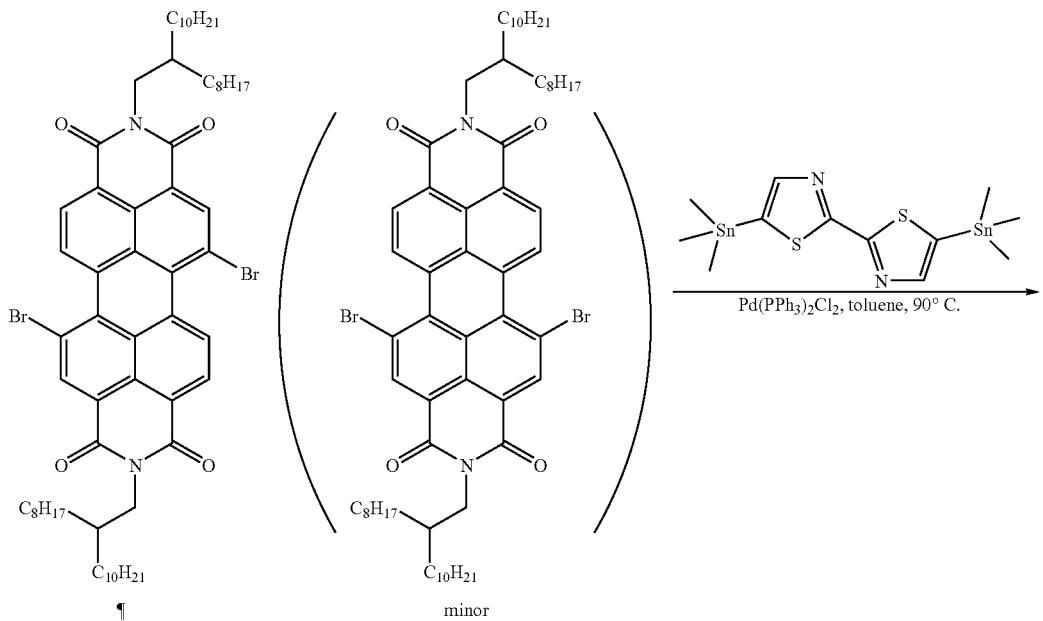

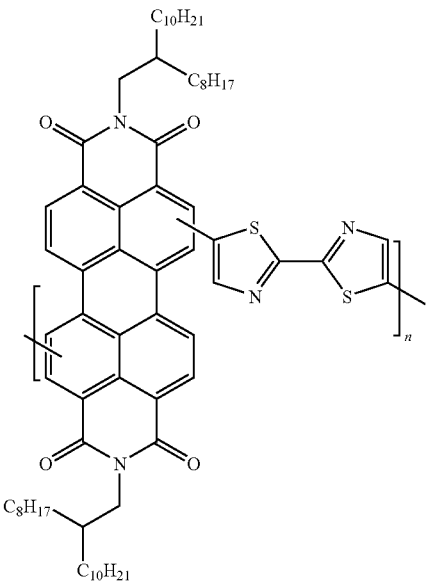

Similarly, as shown in Scheme 2, compounds of the present teachings can be prepared by using different co-monomers, for example, bithiazole compounds, via a Pd-catalyzed Still polymerization. In addition, both Schemes 1 and 2 show that the perylene monomers typically are mixtures of regioisomers and, as a result, the polymers disclosed herein also can be mixtures of regioisomers.

For example, in the various formulae provided above, x can be less than about 0.4, for example, less than about 0.35, less than about 0.30, less than about 0.20, less than about 0.15, less than about 0.10, or less than about 0.05.

Without wishing to be bound by any particular theory, it is believed that polymers of the present teachings that have a regioregular polymeric backbone can lead to higher molecular weights, a more π-conjugated structure and, consequently better charge transport efficiencies. Accordingly, in preparing the present polymers, the present teachings can include enriching and/or isolating one of the possible diastereoisomers. For example, as described in Schemes 1 and 2 above, the present polymers can be prepared from a dibromoperylene anhydride (or the corresponding dibromoperylene dicarboximide). Under the synthetic procedures described in Schemes 1 and 2, the 1,7-diastereoisomer predominates, and accordingly, the present polymers can include a higher percentage of the 1,7-diastereoisomer repeating unit than the 1,6-diastereoisomer repeating unit. However, the brominated intermediate can be enriched or purified as one of the 1,7- or the 1,6-diastereoisomers.

The processes described herein can be monitored according to any suitable method known in the art. For example, product formation can be monitored by spectroscopic means, such as nuclear magnetic resonance spectroscopy (NMR, e.g., $^1H$ or $^{13}C$), infrared spectroscopy (IR), spectrophotometry (e.g., UV-visible), mass spectrometry (MS), or by chromatography such as high pressure liquid chromatograpy (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Certain embodiments of the present polymers can be stable in ambient conditions ("ambient stable") and soluble in common solvents. As used herein, a polymer can be considered electrically "ambient stable" or "stable at ambient conditions" when the carrier mobility or the reduction-potential of the polymer is maintained at about its initial measurement when the polymer is exposed to ambient conditions, for example, air, ambient temperature, and humidity, over a period of time. For example, a polymer according to the present teachings can be described as ambient stable if its carrier mobility or redox potential does not vary more than 20% or more than 10% from its initial value after exposure to ambient conditions, including, air, humidity and temperature, over a 3 day, 5 day, or 10 day period. In addition, a polymer can be considered ambient stable if the optical absorption of the corresponding film does not vary more than 20% (preferably, does not vary more than 10%) from its initial value after exposure to ambient conditions, including air, humidity and temperature, over a 3 day, 5 day, or 10 day period.

Without wishing to be bound by any particular theory, it is believed that if n-channel transport is desired, the strong electron-depleted electronic structure enabled by $M_1$ copolymerized with a strong electron-depleted $M_2$ repeating unit, together with the regioregular highly π-conjugated polymeric backbone of the present polymers, can make the present polymers ambient-stable n-channel semiconductor materials without requiring additional π-core functionalization (i.e., core substitution of the aromatic imide moiety) with strong electron-withdrawing functionalities. If large light absorption (extinction coefficient) is desired, the present polymers can be provided with a highly π-conjugated polymeric backbone and by having the $M_1$ unit copolymerized with an electron-donating $M_2$ comonomer to enable a push-pull structure. If an ambipolar polymer is desired, for example in light-emitting transistor applications, the present polymers can have a highly π-conjugated polymeric backbone comprising a copolymer of $M_1$ and an electron-neutral or electron-donating (electron-rich) $M_2$ unit.

OTFTs based on the present polymers can have long-term operability and continued high-performance in ambient conditions. For example, OTFTs based on certain embodiments of the present polymers can maintain satisfactory device performance in highly humid environment. Certain embodiments of the present polymers also can exhibit excellent thermal stability over a wide range of annealing temperatures. Photovoltaic devices can maintain satisfactory power conversion efficiencies over an extended period of time.

The polymers of the present teachings can have good solubilities in one or more common solvents. As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl)ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone.

The present polymers can be fabricated into various articles of manufacture using solution processing techniques in addition to other more expensive processes such as vapor deposition. Various solution processing techniques have been used with organic electronics. Common solution processing techniques include, for example, spin coating, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like.

Polymers of the present teachings can be used to prepare semiconductor materials (e.g., compositions and composites), which in turn can be used to fabricate various articles of manufacture, structures, and devices. In some embodiments, semiconductor materials incorporating one or more polymers of the present teachings can exhibit n-type semiconductor activity, ambipolar activity, light absorption, and/or light emission.

The present teachings, therefore, further provide methods of preparing a semiconductor material. The methods can include preparing a composition that includes one or more polymers disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a thin film semiconductor) that includes a polymer disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatiblizing agents, curing agents, initiators, humectants, antifoaming agents, wetting agents, pH modifiers, biocides, and bactereriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatiblizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying.

Various articles of manufacture including electronic devices, optical devices, and optoelectronic devices, such as thin film semiconductors, field effect transistors (e.g., thin film transistors), photovoltaics, photodetectors, organic light emitting devices such as organic light emitting diodes (OLEDs) and organic light emitting transistors (OLETs), complementary metal oxide semiconductors (CMOSs), complementary inverters, diodes, capacitors, sensors, D flip-flops, rectifiers, and ring oscillators, that make use of the polymers disclosed herein are within the scope of the present teachings as are methods of making the same. The present polymers can offer processing and operation advantages in the fabrication and/or the use of these devices.

For example, articles of manufacture such as the various devices described herein can include a composite having a semiconductor material of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., described in Yoon, M-H. et al., *PNAS*, 102 (13): 4678-4682 (2005), the entire disclosure of which is incorporated by reference herein), as well as hybrid organic/inorganic dielectric materials (e.g., as described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANT), polypyrrole (PPy)). One or more of the composites described herein can be embodied within various organic electronic, optical, and optoelectronic devices such as organic thin film transistors (OTFTs), specifically, organic field effect transistors (OFETs), as well as sensors, capacitors, unipolar circuits, complementary circuits (e.g., inverter circuits), and the like.

Figure 3:
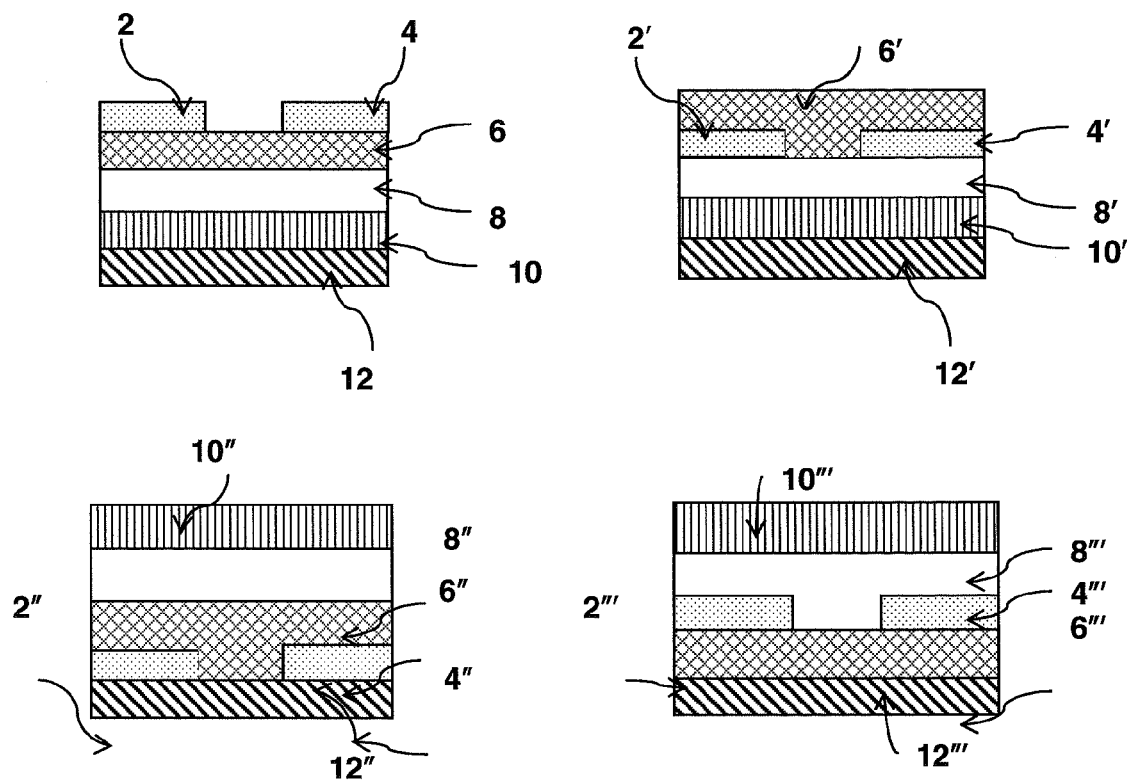
FIG. 3 illustrates four different configurations of thin film transistors: bottom-gate top contact (top left), bottom-gate bottom-contact (top right), top-gate bottom-contact (bottom left), and top-gate top-contact (bottom right); each of which can be used to incorporate polymers of the present teachings.

Accordingly, an aspect of the present teachings relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottom-gate bottom-contact capacitor structures. FIG. 3 illustrates the four common types of OFET structures: (top left) bottom-gate top-contact structure, (top right) bottom-gate bottom-contact structure, (bottom left) top-gate bottom-contact structure, and (bottom right) top-gate top-contact structure. As shown in FIG. 3, an OFET can include a dielectric layer (e.g., shown as 8, 8', 8", and 8'''), a semiconductor layer (e.g., shown as 6, 6', 6", and 6'''), a gate contact (e.g., shown as 10, 10', 10", and 10'''), a substrate (e.g., shown as 12, 12', 12", and 12'''), and source and drain contacts (e.g., shown as 2, 2', 2", 2''', 4, 4', 4", and 4''').

In certain embodiments, OTFT devices can be fabricated with the present polymers on doped silicon substrates, using $SiO_2$ as the dielectric, in top-contact geometries. In particular embodiments, the active semiconductor layer which incorporates at least a polymer of the present teachings can be deposited at room temperature or at an elevated temperature. In other embodiments, the active semiconductor layer which incorporates at least one polymer of the present teachings can be applied by spin-coating or printing as described herein. For top-contact devices, metallic contacts can be patterned on top of the films using shadow masks.

In certain embodiments, OTFT devices can be fabricated with the present polymers on plastic foils, using polymers as the dielectric, in top-gate bottom-contact geometries. In particular embodiments, the active semiconducting layer which incorporates at least a polymer of the present teachings can be deposited at room temperature or at an elevated temperature. In other embodiments, the active semiconducting layer which incorporates at least a polymer of the present teachings can be applied by spin-coating or printing as described herein. Gate and source/drain contacts can be made of Au, other metals, or conducting polymers and deposited by vapor-deposition and/or printing.

Other articles of manufacture in which polymers of the present teachings are useful are photovoltaics or solar cells. Polymers of the present teachings can exhibit broad optical absorption and/or a tuned redox properties and bulk carrier mobilities, making them desirable for such applications. Accordingly, the polymers described herein can be used as an acceptor (n-type) semiconductor or a donor (p-type) semiconductor depending on the nature of the $M_2$ unit in a photovoltaic design, which includes an adjacent p-type or n-type semiconductor material, respectively, that forms a p-n junction. The polymers can be in the form of a thin film semiconductor, which can be deposited on a substrate to form a composite. Exploitation of polymers of the present teachings in such devices is within the knowledge of a skilled artisan.

Figure 7:
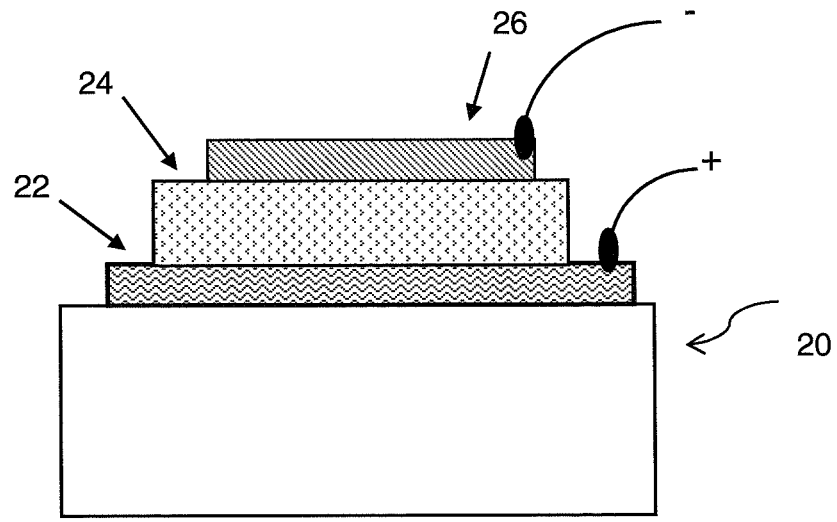
FIG. 7 illustrates a representative structure of a bulk-heterojunction organic photovoltaic device (also known as solar cell) which can incorporate one or more polymers of the present teachings as the donor and/or acceptor materials.
Figure 8:
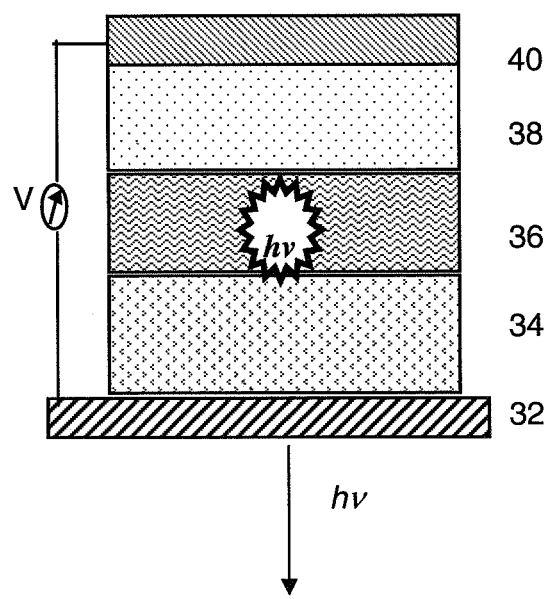
FIG. 8 illustrates a representative structure of an organic light-emitting device which can incorporate one or more polymers of the present teachings as electron-transporting and/or emissive and/or hole-transporting materials.

Accordingly, another aspect of the present teachings relates to methods of fabricating an organic light-emitting transistor, an organic light-emitting diode (OLED), or an organic photovoltaic device that incorporates one or more semiconductor materials of the present teachings. FIG. 7 illustrates a representative structure of a bulk-heterojunction organic photovoltaic device (also known as solar cell) which can incorporate one or more polymers of the present teachings as the donor and/or acceptor materials. As shown, a representative solar cell generally includes a substrate 20 (e.g., glass), an anode 22 (e.g., ITO), a cathode 26 (e.g., aluminium or calcium), and an active layer 24 between the anode and the cathode which can incorporate one or more polymers of the present teachings as the electron donor (p-channel) and/or electron acceptor (n-channel) materials. FIG. 8 illustrates a representative structure of an OLED which can incorporate one or more polymers of the present teachings as electron-transporting and/or emissive and/or hole-transporting materials. As shown, an OLED generally includes a substrate 30 (not shown), a transparent anode 32 (e.g., ITO), a cathode 40 (e.g., metal), and one or more organic layers which can incorporate one or more polymers of the present teachings as hole-transporting (n-channel) (layer 34 as shown) and/or emissive (layer 36 as shown) and/or electron-transporting (p-channel) materials (layer 38 as shown).

The following examples are provided to illustrate further and to facilitate the understanding of the present teachings and are not in any way intended to limit the invention.

All reagents were purchased from commercial sources and used without further purification unless otherwise noted. Specifically, dioxane, dichlorobenzene (DCB), chloroform ($CHCl_3$), and other chlorinated hydrocarbons (CHCS) used for dielectric and semiconductor formulations were purchased from Sigma Aldrich and distilled before use. Anhydrous tetrahydrofuran (THF) was distilled from Na/benzophenone. Conventional Schlenk techniques were used and reactions were carried out under $N_2$ unless otherwise noted. The compound 5,5'-bis(trimethylstannyl)-2,2'-bithiophene was prepared according to the procedures described in Goto et al., *Angew. Chem. Int. Ed.*, vol. 44: 4322 (2005).

Characterization data are provided in some cases by $^1$H-NMR, $^{13}$C-NMR, and/or elemental analysis. NMR spectra were recorded on an Inova 500 NMR spectrometer ($^1$H, 500 MHz). Elemental analyses were performed by Midwest microlab, LLC. Polymer molecular weights were determined on a Waters GPC system (Waters Pump 510) in THF at room temperature versus polystyrene standards.

Example 1

Preparation of poly{[N,N'-bis(2-octyldodecyl)-3,4:9, 10-perylene diimide-(1,7 & 1,6)-diyl]-alt-5,5'-(2,2'-bithiophene)} [P(PDI2OD-T2)]

Preparation of N,N'-bis(2-octyldodecyl)-(1,7 & 1,6)-dibromoperylene-3,4:9,10-bis(dicarboxiamide) (PDI2OD-Br$_2$)

A mixture of PDA-Br$_2$ (0.44 g, 0.80 mmol), 2-octyldodecylamine (0.71 g, 2.4 mmol), o-xylene (3 mL), and propionic acid (1 mL) was stirred at 140° C. for 2 h. Upon cooling to room temperature, most of solvents were removed in vacuo, and the residue was purified by column chromatography on silica gel with a mixture of chloroform:hexane (1:1, v/v, slowly up to 2:1) as eluent, affording a red solid as the product (0.63 g, 0.57 mmol, yield 71.5%). $^1$H NMR (CDCl$_3$ 500 MHz): δ: 9.51 (d, J=8.0 Hz, 2H), 8.94 (s, 2H), 8.71 (d, J=8.0 Hz, 2H), 4.15 (d, J=7.0 Hz, 4H), 2.01 (m, 2H), 1.20-1.50 (m, 64H), 0.84-0.89 (m, 12H). Elemental Analysis (calc. C, 69.30; H, 8.00; N, 2.53): found C, 69.42; H, 8.13; N, 2.61.

Preparation of poly{[N,N'-bis(2-octyldodecyl)-3,4:9,10-perylene diimide-(1,7 & 1,6)-diyl]-alt-5,5'-(2,2'-bithiophene)} [P(PDI2OD-T2)]

Under argon, a mixture of PDI2OD-Br$_2$ (113.9 mg, 0.103 mmol), 5,5'-bis(trimethylstannyl)-2,2'-bithiophene (50.5 mg, 0.103 mmol), and Pd(PPh$_3$)$_2$Cl$_2$ (3.1 mg, 0.004 mmol) in anhydrous toluene (6 mL) was stirred at 90° C. for 2 days. Bromobenzene
(0.2 mL) was then added and the reaction mixture was maintained at 90° C. for an additional 12 hours. Upon cooling to room temperature, a solution of potassium fluoride (1 g) in water (2 mL) was added. This mixture was stirred at room temperature for 2 hours before it was diluted with chloroform (150 mL). The resulting mixture was washed with water (100 mL×3), dried over anhydrous sodium sulfate, and concentrated on a rotary evaporator. The residue was taken with chloroform (25 mL) and precipitated in methanol (50 mL) and acetone (50 mL) in sequence. The isolated dark solid was dissolved in chloroform (25 mL) and heated to boil. Upon cooling to room temperature, the chloroform solution was filtered through a 5 μm filter, and the filtrate was added slowly to methanol (50 mL). The precipitates were collected by filtration, washed with methanol, and dried in vacuum, leading to a deep blue solid as the product (105.0 mg, yield 91.5%). $^1$H NMR (CDCl$_2$CDCl$_2$ 500 MHz): δ: 8.72 (m, br, 2H), 8.40 (s, br, 4H), 7.12-7.45 (m, br, 4H), 4.11 (s, br, 4H), 2.01 (s, br, 2H), 1.15-1.50 (m, br, 64H), 0.84 (s, br, 12H). GPC: M$_n$=11.0K Da, M$_w$=32.1K Da, PDI=2.9. Elemental Analysis (calc. C, 77.65; H, 8.33; N, 2.52): fond C, 76.60; H, 7.94; N, 2.47.

Example 2

Preparation of poly{[N,N'-bis(2-octyldodecyl)-3,4:9,10-perylene diimide-(1,7 & 1,6)-diyl]-alt-5,5'-(2,2'-bithiazole)} [P(PDI2OD-TZ2)]

Under argon, a mixture of PDI2OD-Br$_2$ (123.8 mg, 0.112 mmol), 5,5'-bis(trimethylstannyl)-2,2'-bithiazole (55.1 mg, 0.112 mmol), and Pd(PPh$_3$)$_2$Cl$_2$ (2.4 mg, 0.003 mmol) in anhydrous toluene (7 mL) was stirred at 90° C. for 1 day. Bromobenzene
(0.3 mL) was then added and the resulting mixture was stirred for an additional 12 hours. After cooling to room temperature, a solution of potassium fluoride (1 g) in water (2 mL) was added. This mixture was stirred and shaken at room temperature for 1 hour, before it was diluted with chloroform (150 mL). The resulting mixture was washed with water (100 mL×3), dried over anhydrous Na$_2$SO$_4$, and concentrated on a rotary evaporator. The residue was taken with chloroform (25 mL) and precipitated in methanol (50 mL). This procedure was repeated using chloroform and acetone, leading to a dark solid as the crude product. This crude product was purified by Soxhlet extraction with acetone for 48 hours. The isolated solid was dissolved in chloroform (50 mL) and then heated to boil. Upon cooling to room temperature, this chloroform solution was passed through a syringe filter (5 μm), and the filtrate was precipitated in methanol (50 mL). The precipitates were collected by filtration, washed with methanol, and dried in vacuum, leading to a dark solid (97.8 mg, 78.5%). $^1$H NMR (CDCl$_2$CDCl$_2$, 500 MHz): δ 8.76 (s, br, 2H), 8.47 (s, br, 2H), 8.34 (s, br, 2H), 8.19 (s, br, 2H) 4.14 (s, br, 4H), 2.04 (s, br, 2H), 1.20-1.45 (m, br, 64H), 0.85 (m, 12H). GPC: M$_n$=6.7K Da, M$_w$=44.6K Da, PDI=6.7. Elemental Analysis (calc. C, 75.36; H, 8.13; N, 5.02): found C, 74.99; H, 8.16; N, 4.93.

Example 3

Electrochemistry, Optical Absorption, and MO Energies Determination

Electrochemical measurements were performed using a CH Instruments Model 660A electrochemical workstation. The solvent was dry tetrahydrofuran (THF) containing 0.1 M tetra-n-butylammonium hexafluorophosphate electrolyte. A 1.0 mm diameter platinum disk electrode, a platinum wire counter electrode, and a Ag/Ag$_x$O reference electrode were employed. Ferrocene/Ferrocinium (Fc/Fc$^+$, 0.54 V vs. SCE) was used as an internal reference for all measurements. Optical absorption spectra were obtained on thin films (~30 nm on glass) with a Cary 1 Ultraviolet/Visible Spectrometer. $E_{LUMO}$ is calculated as: —($E_{1/2}^{red-1}$+4.44 eV) assuming that Koopmans' theorem holds ($EA^{red}$≈−$E_{LUMO}$). SCE energy level is taken to be −4.44 eV below the vacuum level. $E_{HOMO}$ is calculated from: HOMO=LUMO−$E_g$ (estimated from optical absorption spectra).

Figure 2:
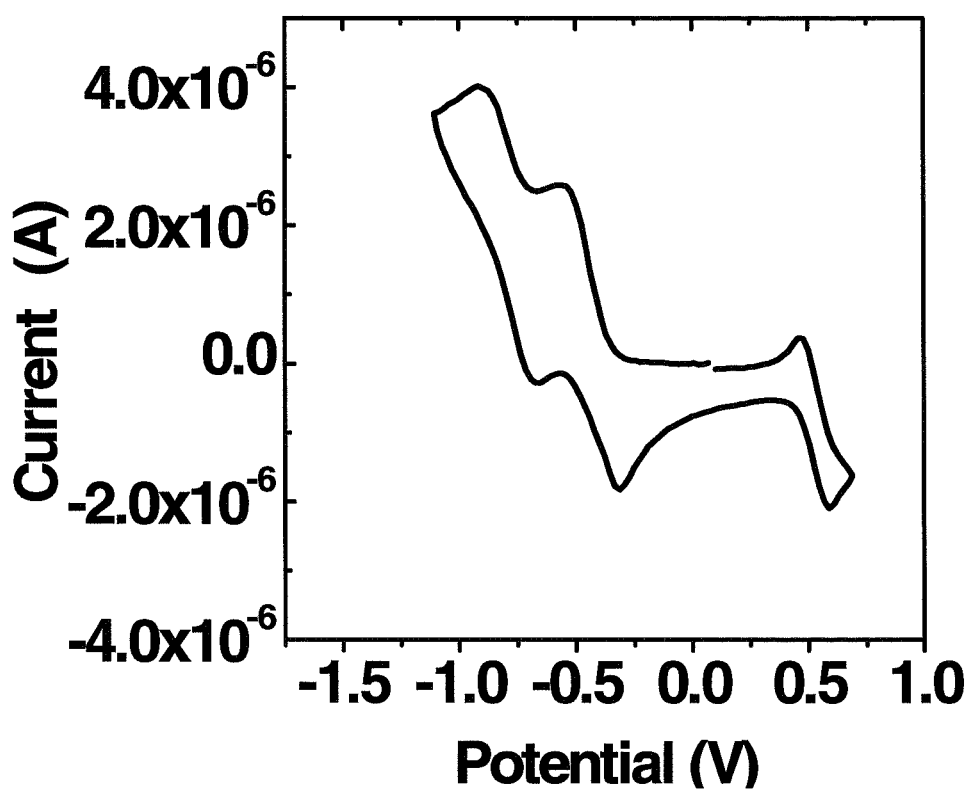
FIG. 2 shows a cyclic voltammogram of a representative polymer of the present teachings (P(PDI2OD-T2)) deposited on a Pt working electrode with silver as the counter electrode in a TFH-TBAPF6 electrolyte solution at the scanning rate of v=80 mV/s with ferrocene as the internal standard (0.54V).

The optical absorption spectrum of P(PDI2OD-T2) exhibited three main absorptions located at λ$_{max}$=594/540/360 nm (FIG. 1). Without wishing to be bound by any particular theory, the corresponding (optical) energy gaps ($E_g$) were estimated from the spectrum low absorption band edge as ~1.65 eV. Polymer thin-film cyclic voltammetry plots exhibited two reversible reductions, with the first/second reduction potentials located at −0.44/−0.80V for P(PDI2OD-T2) (FIG. 2). Similar redox processes were measured for P(PDI2OD-TZ2) although shifted to more negative potentials by ~0.2 V. Without wishing to be bound by any particular theory, by combining solid state optical and electrochemical data, the HOMO/LUMO energies ($E_H$/$E_L$) were estimated at −5.61/−3.96 eV for P(PDI2OD-T2).

Example 4

FET Device Fabrication and Measurements

Bottom-Gate Top-Contact Devices
TFT devices [25-100 μm channel lengths (L) and 1000-5000 μm channel widths (W)] were fabricated with P(PDI2OD-T2) using a top-contact configuration. Semiconductor films were prepared by spin-coating a solution in dichlorobenzene/chloroform (2:98, w/w, 3-10 mg/mL) onto n-doped Si/SiO$_2$ (Ci=11.5 nF/cm$^2$) substrates, which had been pretreated with octadecyltrichlorosilane (OTS), followed by annealing at 110° C. under vacuum for 4 hours. Note that transistor performance did not vary considerably (<10%) when the semiconductor films were annealed at different temperatures (from 110° C. to 240° C.). Au source and drain contacts were evaporated through a shadow mask onto the semiconductor layer. The gate region was accessed by an ohmic contact to the Si.

Top-Gate Bottom-Contact Devices

TFTs were fabricated on glass (PGO glass) substrates. They were used as received or first planarized followed by thermally-evaporated Au source-drain contacts (30 nm-thick). These substrates were coated with the semiconductor layer deposited by spin-coating (dichlorobenzene/chloroform:2:98, w/w, 3-10 mg/mL). Typical semiconductor film thicknesses are between about 40 nm and about 120 nm. Next, the dielectric layer was spin-coated to afford 400-1200 nm thick films The film dielectric constant (e) is ~3.0-3.2. The device structure was completed by vapor deposition of patterned Au gate contacts (~30 nm thick) through a shadow mask. Channel lengths and widths are 25-75 μm and 0.5-1.5 mm, respectively, to afford W/L=20.

Figure 4:
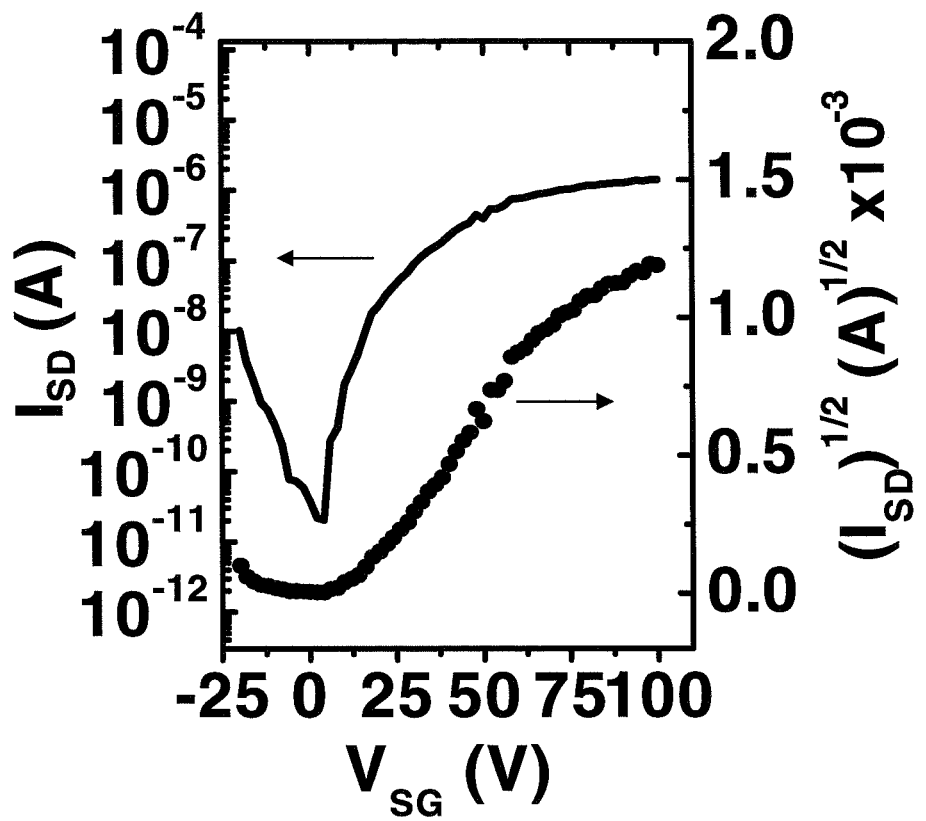
FIG. 4 shows TFT transfer plots of current vs. $V_{SG}$ for a bottom-gate top-contact TFT that incorporates a representative polymer of the present teachings (P(PDI2OD-T2)).
Figure 5:
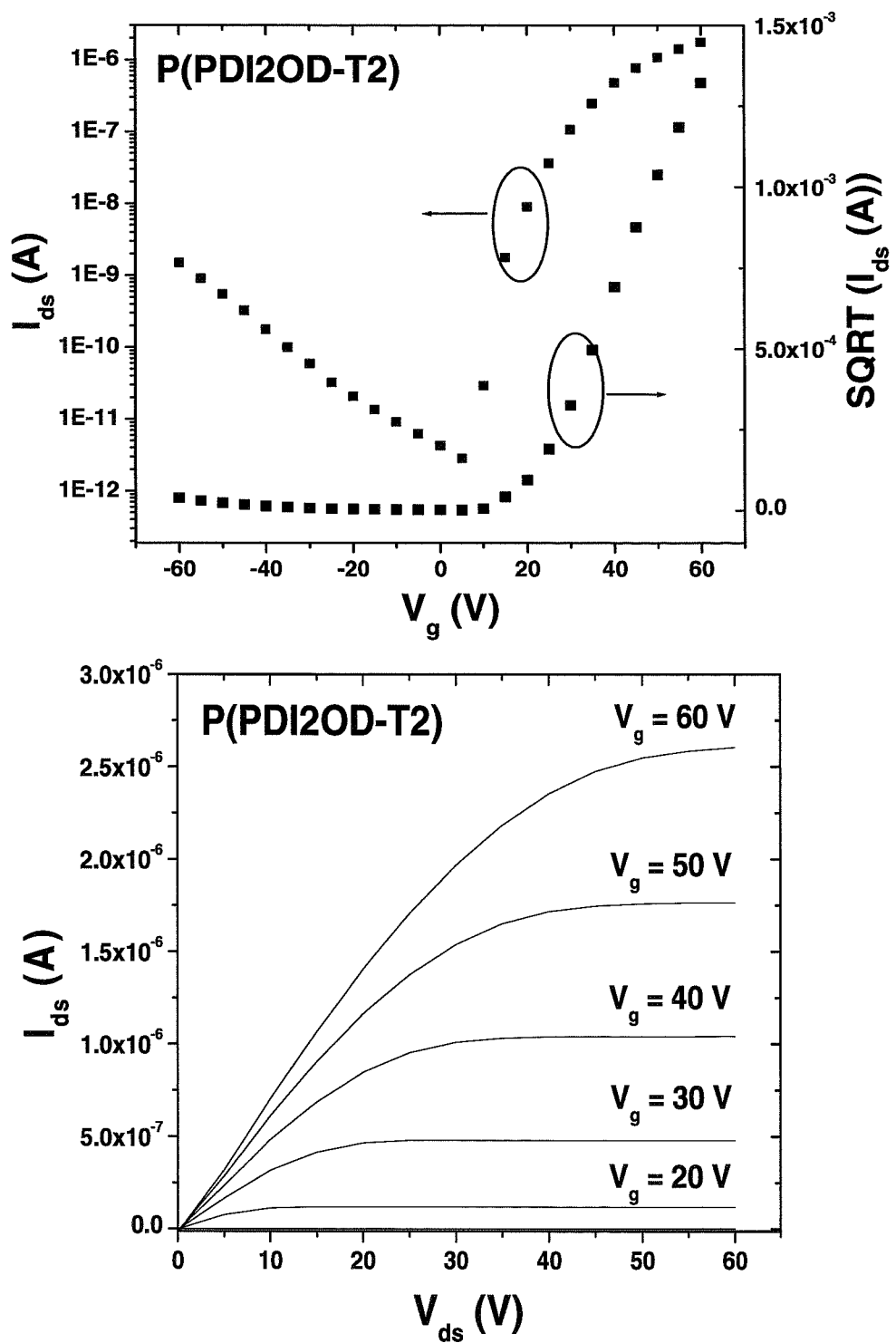
FIG. 5 shows a TFT transfer plot of current vs. $V_{SG}$ (top) and an output plot of current vs $V_{SD}$ (bottom), respectively, for a top-gate bottom-contact TFT that incorporates a representative polymer of the present teachings (P(PDI2OD-T2)).
Figure 6:
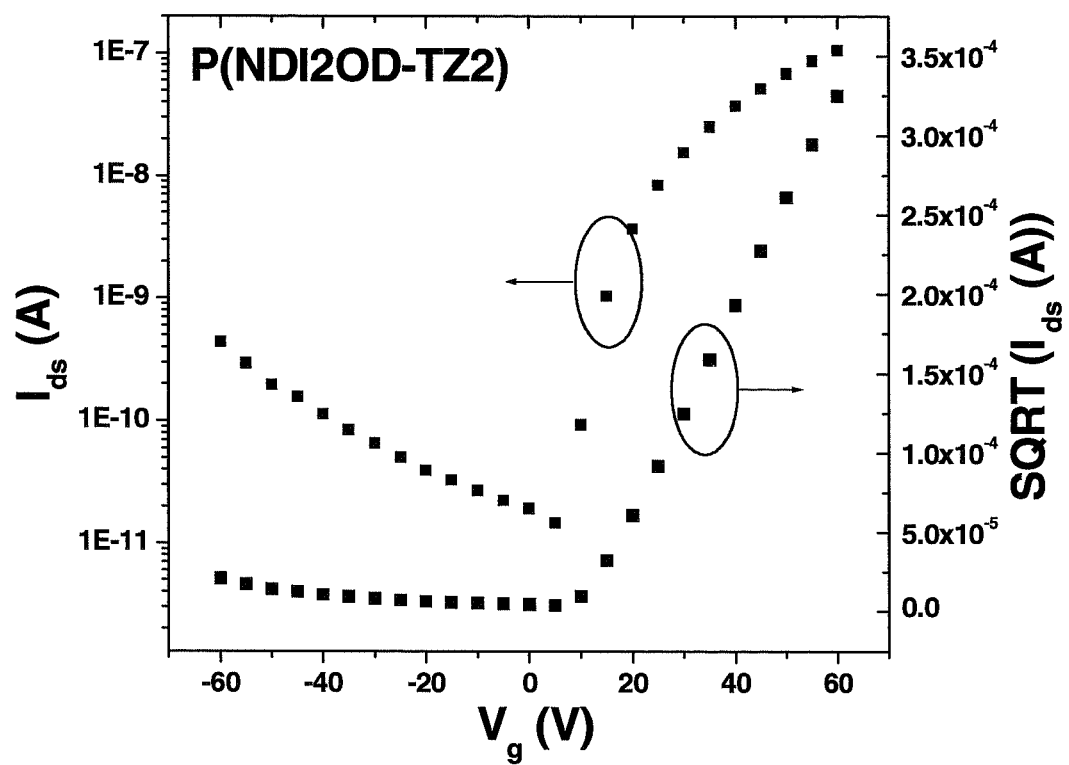
FIG. 6 shows TFT transfer plots of current vs. $V_{SG}$ for a top-gate bottom-contact TFT that incorporates a representative polymer of the present teachings (P(PDI2OD-TZ2)).

Electrical measurements were performed both under high vacuum and under ambient conditions. Typical current-voltage plots are shown in FIGS. 4-6, with μ calculated in saturation from the equation $\mu=(2I_{SD}L)/[WC_i(V_{SG}-V_{th})^2]$. The positive gate and source-drain voltages demonstrated that polymers of the present teachings can be n-channel semiconductors. Electron mobilities of ~0.002 cm$^2$ V$^{-1}$s$^{-1}$ for bottom-gate top-contact P(PDI2OD-T2)-based TFTs were measured in vacuum. Electron mobilities of ~0.02 cm$^2$ V$^{-1}$s$^{-1}$ for top-gate bottom-contact P(PDI2OD-T2)-based TFTs were measured under ambient conditions. Electron mobilities of ~0.001 cm$^2$ V$^{-1}$s$^{-1}$ for top-gate bottom-contact P(PDI2OD-TZ2)-based TFTs were measured under ambient conditions. Current on-off ratios are >10$^5$.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

What is claimed is:

1. A polymer selected from the formula:

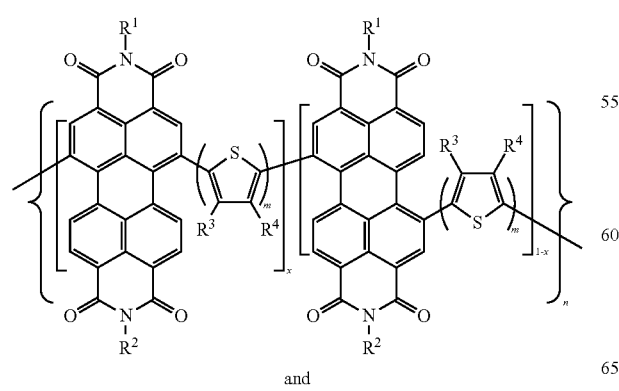

and

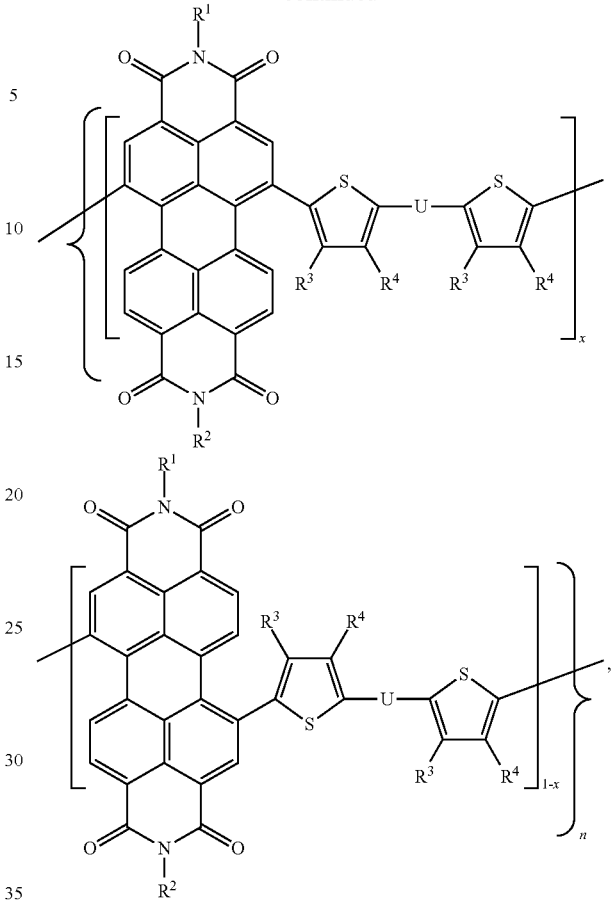

wherein:

R$^1$ and R$^2$ independently are selected from H, a C$_{1-40}$ alkyl group, a C$_{2-40}$ alkenyl group, a C$_{1-40}$ haloalkyl group, and an organic group comprising 1-4 cyclic moieties, wherein:

each of the C$_{1-40}$ alkyl group, the C$_{2-40}$ alkenyl group, and the C$_{1-40}$ haloalkyl group can be optionally substituted with 1-10 substituents independently selected from a halogen, —CN, NO$_2$, OH, —NH$_2$, —NH(C$_{1-20}$ alkyl), —N(C$_{1-20}$ alkyl)$_2$, —S(O)$_2$OH, —CHO, —C(O)—C$_{1-20}$ alkyl, —C(O)OH, —C(O)—OC$_{1-20}$ alkyl, —C(O)NH$_2$, —C(O)NH—C$_{1-20}$ alkyl, —C(O)N(C$_{1-20}$ alkyl)$_2$, —OC$_{1-20}$ alkyl, —SiH$_3$, —SiH(C$_{1-20}$ alkyl)$_2$, —SiH$_2$(C$_{1-20}$ alkyl), and —Si(C$_{1-20}$ alkyl)$_3$;

each of the C$_{1-40}$ alkyl group, the C$_{2-40}$ alkenyl group, and the C$_{1-40}$ haloalkyl group can be covalently bonded to the imide nitrogen atom via an optional linker; and each of the 1-4 cyclic moieties in the organic group can be the same or different, can be covalently bonded to each other or the imide nitrogen via an optional linker, and can be optionally substituted with 1-5 substituents independently selected from a halogen, oxo, —CN, NO$_2$, OH, =C(CN)$_2$, —NH$_2$, —NH(C$_{1-20}$ alkyl), —N(C$_{1-20}$ alkyl)$_2$, —S(O)$_2$OH, —CHO, —C(O)OH, —C(O)—C$_{1-20}$ alkyl, —C(O)—OC$_{1-20}$ alkyl, —C(O)NH$_2$, —C(O)NH—C$_{1-20}$ alkyl, —C(O)N(C$_{1-20}$ alkyl)$_2$, —SiH$_3$, —SiH(C$_{1-20}$ alkyl)$_2$, —SiH$_2$(C$_{1-20}$ alkyl), —Si(C$_{1-20}$ alkyl)$_3$, —O—C$_{1-20}$ alkyl, —O—C$_{1-20}$ alkenyl, —O—C$_{1-20}$ haloalkyl, a C$_{1-20}$ alkyl group, a C$_{1-20}$ alkenyl group, and a C$_{1-20}$ haloalkyl group;

R³ and R⁴, at each occurrence, are independently selected from a) H, b) halogen, c) —CN, d) —NO₂, e) —OH, f) —CHO, g) —C(O)—C$_{1-10}$ alkyl, h) —C(O)—C$_{6-14}$ aryl, i) —C(O)OH, j) —C(O)—OC$_{1-10}$ alkyl, k) —C(O)—OC$_{6-14}$ aryl, l) —C(O)NH₂, m) —C(O)NH—C$_{1-10}$ alkyl, n) —C(O)N(C$_{1-10}$ alkyl)₂, o) —C(O)NH—C$_{6-14}$ aryl, p) —C(O)N(C$_{1-10}$ alkyl)-C$_{6-14}$ aryl, q) —C(O)N(C$_{6-14}$ aryl)₂, r) a C$_{1-40}$ alkyl group, s) a C$_{2-40}$ alkenyl group, t) a C$_{2-40}$ alkynyl group, u) a C$_{1-40}$ alkoxy group, v) a C$_{1-40}$ alkylthio group, and w) a C$_{1-40}$ haloalkyl group;

U is a conjugated linear or polycyclic linker;

m is 1, 2, 3, 4, 5 or 6;

x is a real number and 0<x<1; and n is an integer between 4 and 1,000.

2. The polymer of claim 1 selected from:

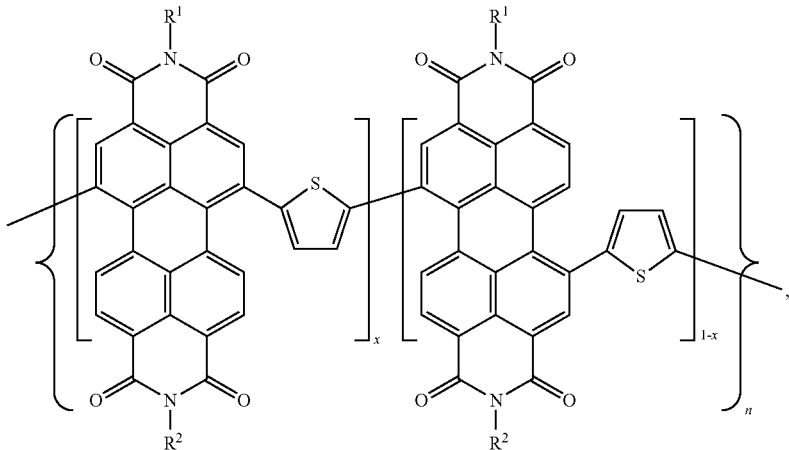

,

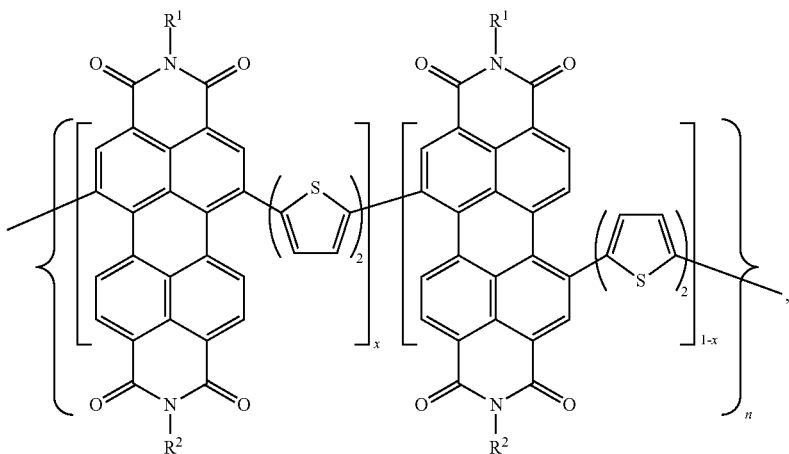

,

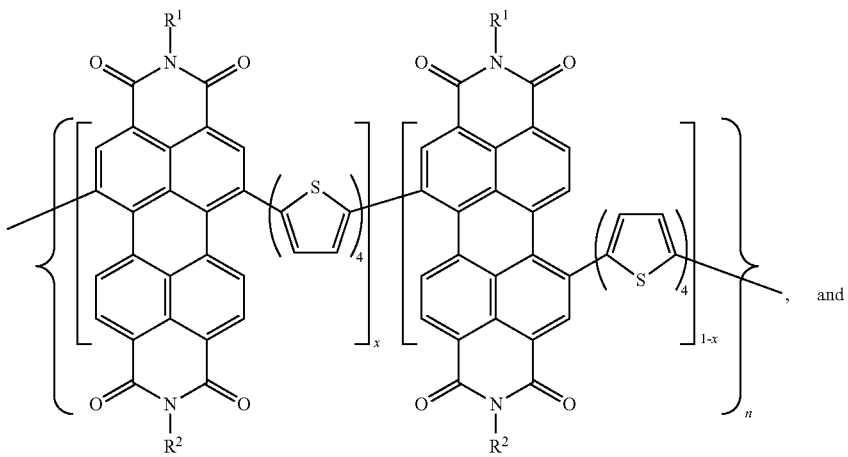

, and

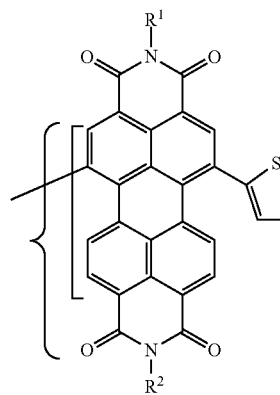
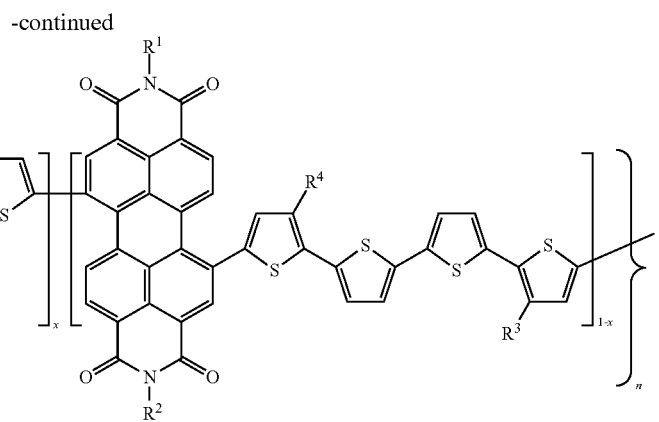
wherein
R¹, R², R³, R⁴, x and n are as defined in claim 1.
3. The polymer of claim 1, wherein R¹ and R² are independently selected from:
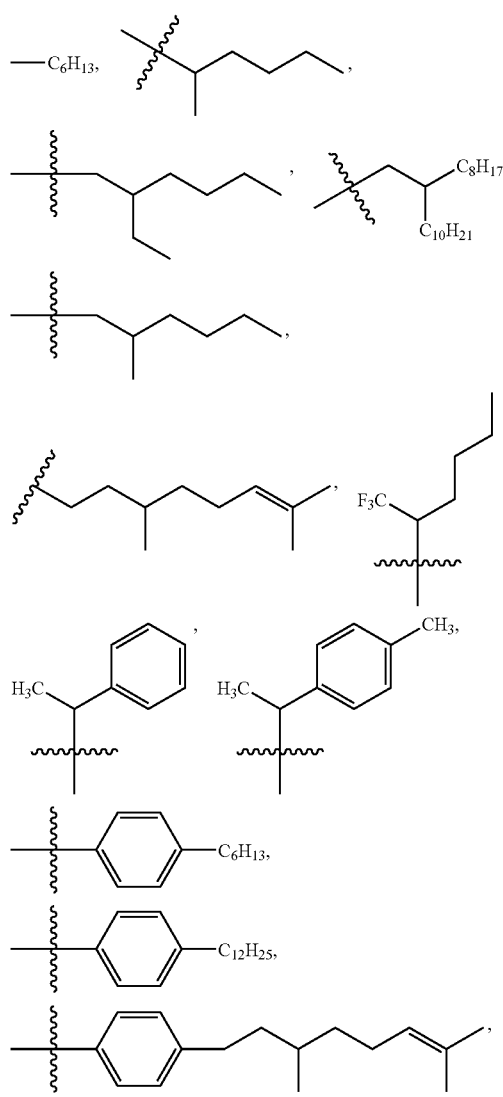
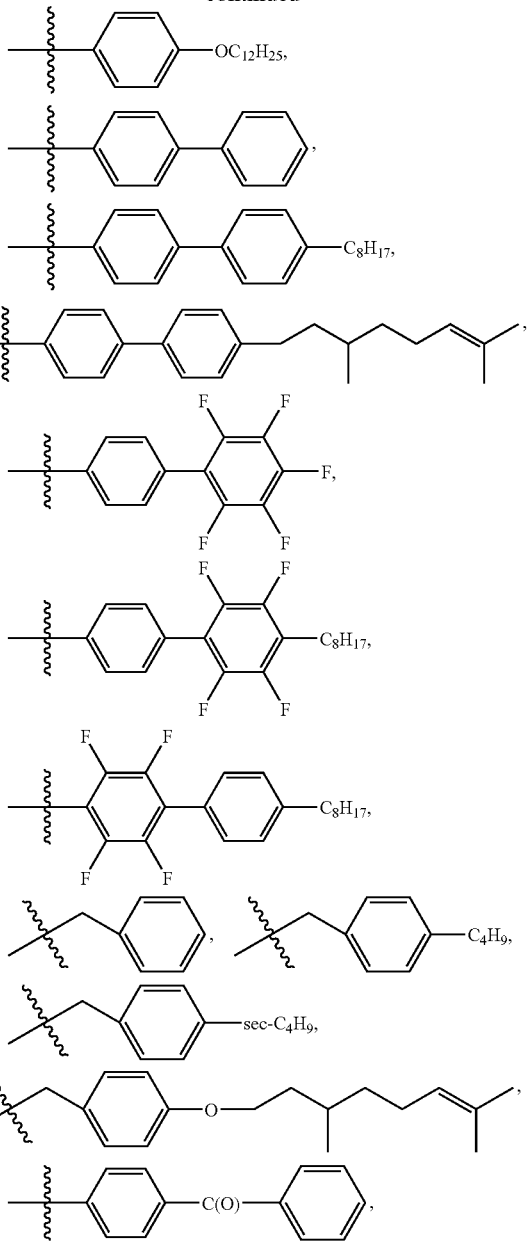

-continued

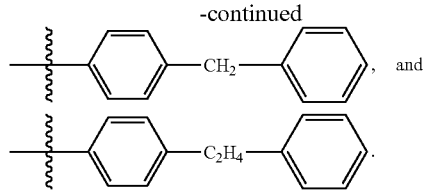
, and

5

4. The polymer of claim 1, wherein $R^1$ and $R^2$ are independently a branched $C_{3-30}$ alkyl group or a branched $C_{3-30}$ alkenyl group.

5. The polymer of claim 1, wherein $R^1$ and $R^2$ are independently selected from an n-hexyl group, a 1-methylpropyl group, a 1-methylbutyl group, a 1-methylpentyl group, a 1-methylhexyl group, a 1-ethylpropyl group, a 1-ethylbutyl group, a 1-3,dimethylbutyl group, and a 2-octyldodecyl group.

* * * * *